US011164960B1

(12) United States Patent
Zhang et al.

(10) Patent No.: US 11,164,960 B1
(45) Date of Patent: Nov. 2, 2021

(54) TRANSISTOR HAVING IN-SITU DOPED NANOSHEETS WITH GRADIENT DOPED CHANNEL REGIONS

(71) Applicant: International Business Machines Corporation, Armonk, NY (US)

(72) Inventors: Jingyun Zhang, Albany, NY (US); Ruilong Xie, Niskayuna, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/860,614

(22) Filed: Apr. 28, 2020

(51) Int. Cl.
*H01L 29/66* (2006.01)
*H01L 29/10* (2006.01)
*H01L 29/786* (2006.01)
*H01L 29/06* (2006.01)
*H01L 29/78* (2006.01)

(52) U.S. Cl.
CPC .... *H01L 29/66795* (2013.01); *H01L 29/0665* (2013.01); *H01L 29/1033* (2013.01); *H01L 29/785* (2013.01); *H01L 29/78696* (2013.01)

(58) Field of Classification Search
CPC ......... H01L 29/42376; H01L 21/02603; H01L 29/0843; H01L 29/0673; H01L 29/7827
See application file for complete search history.

(56) References Cited

U.S. PATENT DOCUMENTS

| | | | |
|---|---|---|---|
| 9,812,449 B2 | 11/2017 | Obradovic et al. | |
| 10,170,316 B2 | 1/2019 | Jagannathan et al. | |
| 10,170,484 B1 | 1/2019 | Sung et al. | |
| 10,312,337 B2 | 6/2019 | Balakrishnan et al. | |
| 2016/0020305 A1* | 1/2016 | Obradovic | H01L 27/0605 257/39 |
| 2017/0323941 A1* | 11/2017 | Obradovic | H01L 29/42392 |

(Continued)

FOREIGN PATENT DOCUMENTS

CN 109273441 A 1/2019

OTHER PUBLICATIONS

Anonymous, "Method to Form Multi-Vt in Nanosheet Devices using a cladded doped material," IPCOM000255832D, Oct. 2018, 6 pages.

(Continued)

*Primary Examiner* — Changhyun Yi
(74) *Attorney, Agent, or Firm* — Cantor Colburn LLP; Jeffrey S LaBaw

(57) ABSTRACT

Embodiments of the invention are directed to a method of performing fabrication operations to form a transistor. The fabrication operations include forming a nanosheet having a first nanosheet sidewall and a second nanosheet sidewall. The nanosheet is communicatively coupled to a source region at the first nanosheet sidewall. The nanosheet is communicatively coupled to a drain region at the second nanosheet sidewall. The nanosheet further includes a source-side nanosheet region that includes the first nanosheet sidewall. The nanosheet further includes a drain-side nanosheet region that includes the second nanosheet sidewall. Dopants are provided in the source-side nanosheet region using an in-situ doping process, wherein a doping concentration in the source-side nanosheet region is greater than a doping concentration of the drain-side nanosheet region.

20 Claims, 20 Drawing Sheets

(56) References Cited

U.S. PATENT DOCUMENTS

2018/0240871 A1  8/2018  Cheng et al.
2018/0253568 A1  9/2018  Cheng et al.
2019/0252495 A1  8/2019  Bao et al.

OTHER PUBLICATIONS

Baek et al., "Device Optimization of N-Channel MOSFETs with Lateral Asymmetric Channel Doping Profiles," Transactions on Electrical and Electronic Materials 11.1 (2010): 15-19.
Narasimhulu et al., "Impact of Lateral Asymmetric Channel Doping on Deep Submicrometer Mixed-Signal Device and Circuit Performance," IEEE Transactions on Electron Devices 50.12 (2003): 2481-2489.
Yoon et al., "Multi-Vth Strategies of 7-nm node Nanosheet FETs With Limited Nanosheet Spacing," IEEE Journal of the Electron Devices Society 6 (2018): 861-865.

* cited by examiner

TRANSISTOR HAVING IN-SITU DOPED NANOSHEETS WITH GRADIENT DOPED CHANNEL REGIONS

BACKGROUND

The present invention relates in general to fabrication methods and resulting structures for semiconductor devices. More specifically, the present invention relates to fabrication methods and resulting structures for transistors having in-situ doped nanosheets configured to create a gradient doping concentration and a gradient threshold voltage (Vt) level along the channel regions of the nanosheets.

In contemporary semiconductor device fabrication processes, a large number of metal oxide semiconductor field effect transistors (MOSFETs), such as n-type field effect transistors (nFETs) and p-type field effect transistors (pFETs), are fabricated on a single wafer. Non-planar MOSFET architectures (e.g., fin-type FETs (FinFETs) and nanosheet FETs) can provide increased device density and increased performance over planar MOSFETs. For example, nanosheet FETs, in contrast to conventional planar MOSFETs, include a gate stack that wraps around the full perimeter of multiple stacked and spaced apart nanosheet channel regions for a reduced device footprint and improved control of channel current flow.

The threshold voltage (Vt) of a transistor is the voltage level that must be achieved between the gate and the source in order to turn the transistor on. More specifically, when a voltage greater than Vt is applied to the transistor gate, the transistor is turned on, and current flows from the transistor's source through the channel to the drain. When the voltage at the gate is less than Vt, the switch is off, and current does not flow through the transistor.

SUMMARY

Embodiments of the invention are directed to a method of performing fabrication operations to form a transistor. The fabrication operations include forming a nanosheet having a first nanosheet sidewall and a second nanosheet sidewall. The nanosheet is communicatively coupled to a source region at the first nanosheet sidewall. The nanosheet is communicatively coupled to a drain region at the second nanosheet sidewall. The nanosheet further includes a source-side nanosheet region that includes the first nanosheet sidewall. The nanosheet further includes a drain-side nanosheet region that includes the second nanosheet sidewall. Dopants are provided in the source-side nanosheet region using an in-situ doping process, wherein a doping concentration in the source-side nanosheet region is greater than a doping concentration of the drain-side nanosheet region.

Embodiments of the invention are directed to a method of performing fabrication operations to form a nanosheet field effect transistor (FET) device. The fabrication operations include forming a nanosheet having a first nanosheet sidewall and a second nanosheet sidewall. The nanosheet is communicatively coupled to a source region at the first nanosheet sidewall. The nanosheet is communicatively coupled to a drain region at the second nanosheet sidewall. The nanosheet further includes a source-side nanosheet region that includes the first nanosheet sidewall. The nanosheet further includes a drain-side nanosheet region that includes the second nanosheet sidewall. Dopants are provided in the source-side nanosheet region by incorporating an in-situ doping process into a process used to form the source-side nanosheet region, wherein a doping concentration in the source-side nanosheet region is greater than a doping concentration of the drain-side nanosheet region.

Embodiments of the invention are directed to a transistor that includes a nanosheet having a first nanosheet sidewall and a second nanosheet sidewall. The nanosheet is communicatively coupled to a source region at the first nanosheet sidewall. The nanosheet is communicatively coupled to a drain region at the second nanosheet sidewall. The nanosheet further includes a source-side nanosheet region that includes the first nanosheet sidewall. The nanosheet further includes a drain-side nanosheet region that includes the second nanosheet sidewall. The source-side nanosheet region includes in-situ dopants, wherein a doping concentration in the source-side nanosheet region is greater than a doping concentration of the drain-side nanosheet region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-9 depict multiple cross-sectional views of a nanosheet-based structure after various fabrication operations for forming a transistor having in-situ and source-side doped nanosheets configured to create a gradient Vt level along the channel regions of the nanosheets in accordance with aspects of the invention, in which:

FIG. 1 depicts cross-sectional views of the nanosheet-based structure after initial fabrication operations in accordance with aspects of the present invention;

FIG. 2 depicts a cross-sectional view of the nanosheet-based structure after additional fabrication operations in accordance with aspects of the present invention;

FIG. 3 depicts a cross-sectional view of the nanosheet-based structure after additional fabrication operations in accordance with aspects of the present invention;

FIG. 4 depicts a cross-sectional view of the nanosheet-based structure after additional fabrication operations in accordance with aspects of the present invention;

FIG. 5 depicts a cross-sectional view of the nanosheet-based structure after additional fabrication operations in accordance with aspects of the present invention;

FIG. 6 depicts a cross-sectional view of the nanosheet-based structure after additional fabrication operations in accordance with aspects of the present invention;

FIG. 7 depicts a cross-sectional view of the nanosheet-based structure after additional fabrication operations in accordance with aspects of the present invention;

FIG. 8 depicts a cross-sectional view of the nanosheet-based structure after additional fabrication operations in accordance with aspects of the present invention; and FIG. 9 depicts a cross-sectional view of the nanosheet-based structure after additional fabrication operations in accordance with aspects of the present invention; and FIGS. 10-20 depict cross-sectional views of a nanosheet-based structure after various fabrication operations for forming a transistor having in-situ and source-side doped nanosheets configured to create a gradient Vt level along the channel regions of the nanosheets in accordance with aspects of the invention, in which:

FIG. 10 depicts a cross-sectional view of the nanosheet-based structure after fabrication operations in accordance with aspects of the present invention;

FIG. 11 depicts a cross-sectional view of the nanosheet-based structure after additional fabrication operations in accordance with aspects of the present invention;

FIG. 12 depicts a cross-sectional view of the nanosheet-based structure after additional fabrication operations in accordance with aspects of the present invention;

FIG. 13 depicts a cross-sectional view of the nanosheet-based structure after additional fabrication operations in accordance with aspects of the present invention;

FIG. 14 depicts a cross-sectional view of the nanosheet-based structure after additional fabrication operations in accordance with aspects of the present invention;

FIG. 15 depicts a cross-sectional view of the nanosheet-based structure after additional fabrication operations in accordance with aspects of the present invention;

FIG. 16 depicts a cross-sectional view of the nanosheet-based structure after additional fabrication operations in accordance with aspects of the present invention;

FIG. 17 depicts a cross-sectional view of the nanosheet-based structure after additional fabrication operations in accordance with aspects of the present invention;

FIG. 18 depicts a cross-sectional view of the nanosheet-based structure after additional fabrication operations in accordance with aspects of the present invention;

FIG. 19 depicts a cross-sectional view of the nanosheet-based structure after additional fabrication operations in accordance with aspects of the present invention; and FIG. 20 depicts a cross-sectional view of the nanosheet-based structure after additional fabrication operations in accordance with aspects of the present invention.

DETAILED DESCRIPTION

Figure 1:
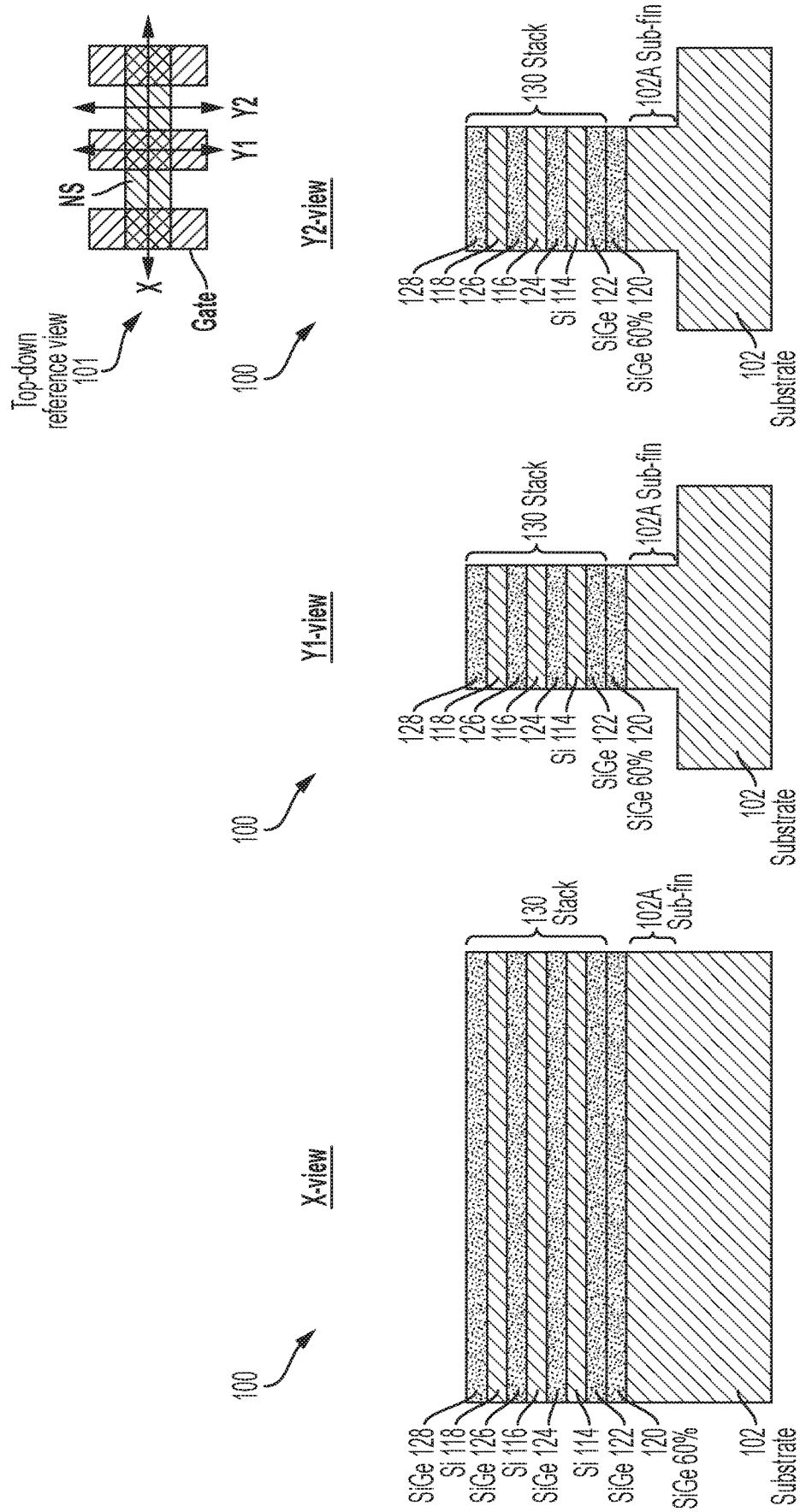

Although this detailed description includes examples of how aspects of the invention can be implemented to form a transistor having in-situ doped source-side Si nanosheets configured to create a gradient doping concentration level and a gradient Vt along channel regions of the Si nanosheets, implementation of the teachings recited herein are not limited to a particular type of FET structure or combination of materials. Rather, embodiments of the present invention are capable of being implemented in conjunction with any other type of transistor device (planar, non-planar, p-FET, n-FET) or material (e.g., Si or SiGe), now known or later developed, wherein it is desirable to create a gradient doping concentration level and a gradient Vt level along the transistor's channel region(s).

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, semiconductor devices (e.g., FETs) are formed using active regions of a wafer. The active regions are defined by isolation regions used to separate and electrically isolate adjacent semiconductor devices. For example, in an IC having a plurality of MOSFETs, each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions.

GAA nanosheet FETs are fabricated by forming alternating layers of non-sacrificial nanosheets and sacrificial nanosheets. The sacrificial nanosheets are released from the non-sacrificial nanosheets before the FET device is finalized. For n-type FETs, the non-sacrificial nanosheets are typically silicon (Si) and the sacrificial nanosheets are typically silicon germanium (SiGe). For p-type FETs, the non-sacrificial nanosheets can be SiGe and the sacrificial nanosheets can be Si. In some implementations, the non-sacrificial nanosheet of a p-type FET can be SiGe or Si, and the sacrificial nanosheets can be Si or SiGe. Forming the GAA nanosheets from alternating layers of non-sacrificial nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior non-sacrificial electrostatics control, which is necessary for continuously scaling gate lengths down to seven (7) nanometer CMOS technology and below. The use of multiple layered SiGe/Si sacrificial/non-sacrificial nanosheets (or Si/SiGe sacrificial/non-sacrificial nanosheets) to form the channel regions in GAA FET semiconductor devices provides desirable device characteristics, including the introduction of strain at the interface between SiGe and Si.

In general, the Vt of an FET is the minimum gate-to-source voltage (Vgs) that is needed to turn the FET on and create a conducting path between the source terminal and the drain terminal. Vt is determined by several factors including the doping levels in the MOSFET channel. A technique known as lateral asymmetric channel (LAC) doping can, in theory, improve the electrical characteristics of planar MOSFETs by making the channel doping concentration asymmetrical such that the channel doping concentration on the source side of the channel is higher than the channel doping concentration on the drain side of the channel. During device operation, the channel potential transition that occurs at the source-side of the channel region will, in theory, be much steeper in planar MOSFETs that use LAC due to the non-uniform channel doping. Providing a steep potential distribution near the source-side of the MOSFET channel would, in theory, enhance the lateral channel electric field, thereby increasing the carrier mobility in the channel.

In practice, however, known LAC doping techniques are difficult to implement and control because the methods (e.g., implantation) used to embed dopants in the source-side of the channel are difficult to control. For non-planar transistor architectures such as nanosheet transistors, it is not practical to apply known LAC doping techniques because it is difficult to selectively implant dopants into the relatively thin (e.g., from about 3 nm to about 8 nm) nanosheets that form the channel regions of a nanosheet transistor. Accordingly, non-planar fully depleted channel architectures (e.g., FinFETs, gate-all-around (GAA) nanosheet transistors, and the like) rely on the use of multiple work function metals in the gate stacks to achieve multiple Vt levels.

Turning now to an overview of aspects of the invention, embodiments of the invention provide fabrication methods and resulting structures for forming a transistor having in-situ and source-side doped channel structures configured to create a gradient doping concentration and a gradient Vt level along the channel region of the transistor's channel structure. As used herein, the term gradient refers to an increase or decrease in the magnitude of a property (e.g. temperature, pressure, or concentration) observed in passing from one point or moment to another. More specifically, as applied to aspects of invention, the terms "gradient doping concentration" refer to a decrease in the magnitude of a doping concentration passing from the one side of the transistor's channel structure to an opposite side of the transistor's channel structure. Additionally, as applied to aspects of invention, the terms "gradient Vt level" refer to an increase in the magnitude of the transistor's Vt passing from the one side of the transistor's channel structure to an opposite side of the transistor's channel structure. In accordance with aspects of the invention, a higher doping concentration is achieved in one side of the channel structure by using a well-controlled in-situ doped epitaxial growth process to form a portion of the channel structure in which the channel will be formed. In general, epitaxial growth processes with in-situ doping are well-controlled in that the newly grown in-situ doped material is formed layer-by-layer, wherein each layer is extremely thin, and wherein doping in integrated within and part of the layer growth process. In some embodiments of the invention, the channel structure can be implemented as a series of stacked and spaced apart nanosheets, and the channel can be the portion of each nanosheet that is under the transistor's gate structure. In some embodiments of the invention, the higher doping concentration is achieved in the source-side side of the channel structure.

In some aspects of the invention, the transistor's channel can be formed by forming an initial undoped channel structure and replacing a portion of the initial undoped channel structure with a doped region having a higher dopant concentration than the remaining portion of the initial undoped channel structure. In some aspects of the invention, replacing the portion of the initial undoped channel structure with the doped region can be accomplished by epitaxially growing the doped region from an exposed surface of the initial undoped channel structure, wherein an in-situ doping process is incorporated as part of epitaxially growing the doped region from the exposed surface of the initial undoped channel structure. In some embodiments of the invention, the channel structure can be implemented as a series of stacked and spaced apart nanosheets, and the channel can be the portion of each nanosheet that is under the transistor's gate structure. In some embodiments of the invention, the doped region is formed in the source-side side of the channel structure.

In some aspects of the invention, subsequent to the above-described in-situ doping process, the area of the doped source-side channel region is increased by exposing the doped region to one or more temperatures (or ranges of temperatures) that are sufficient to cause the dopants in the doped region to diffuse into parts of the remaining portion of initial undoped channel structure. In some aspects of the invention, the above-described temperatures result from processes that are used to form the S/D regions of the transistor. In some aspects of the invention, the above-described temperatures result from dopant drive-in processes that are applied subsequent to forming the S/D regions of the transistor. In some aspects of the invention, the above-described temperatures result from processes that are used to form the S/D regions of the transistor, and also result from dopant drive-in processes that are applied subsequent to forming the S/D regions of the transistor.

In aspects of the invention, the transistor is a nanosheet transistor; the channel structure is a series of stacked and spaced apart nanosheet; the transistor's channel is the portions of the spaced-apart and stacked nanosheets that are under the gate regions of the nanosheet transistor; the channel length of each spaced-apart and stacked nanosheet is the portion of each spaced-apart and stacked nanosheet that is under a gate region of the nanosheet transistor; and the gate length is the length dimension of the portions of the gate structure that are over the transistor's channel. In embodiments of the invention, the channel length is substantially the same as the gate length. In accordance with aspects of the invention, a length dimension of the doped portion of the channel is between about 20% and about 50% of the channel length dimension.

Figure 7:
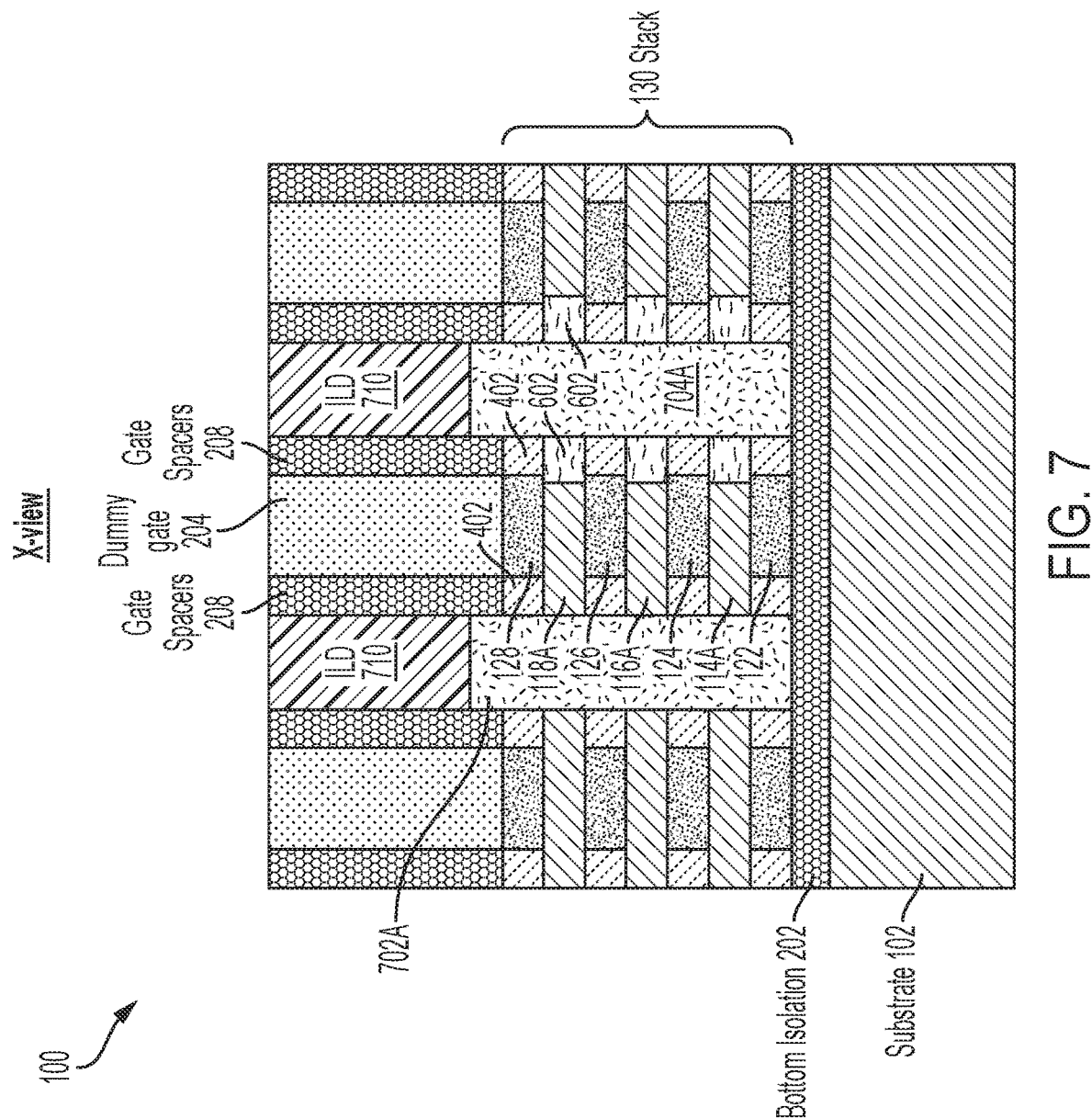
Figure 8:
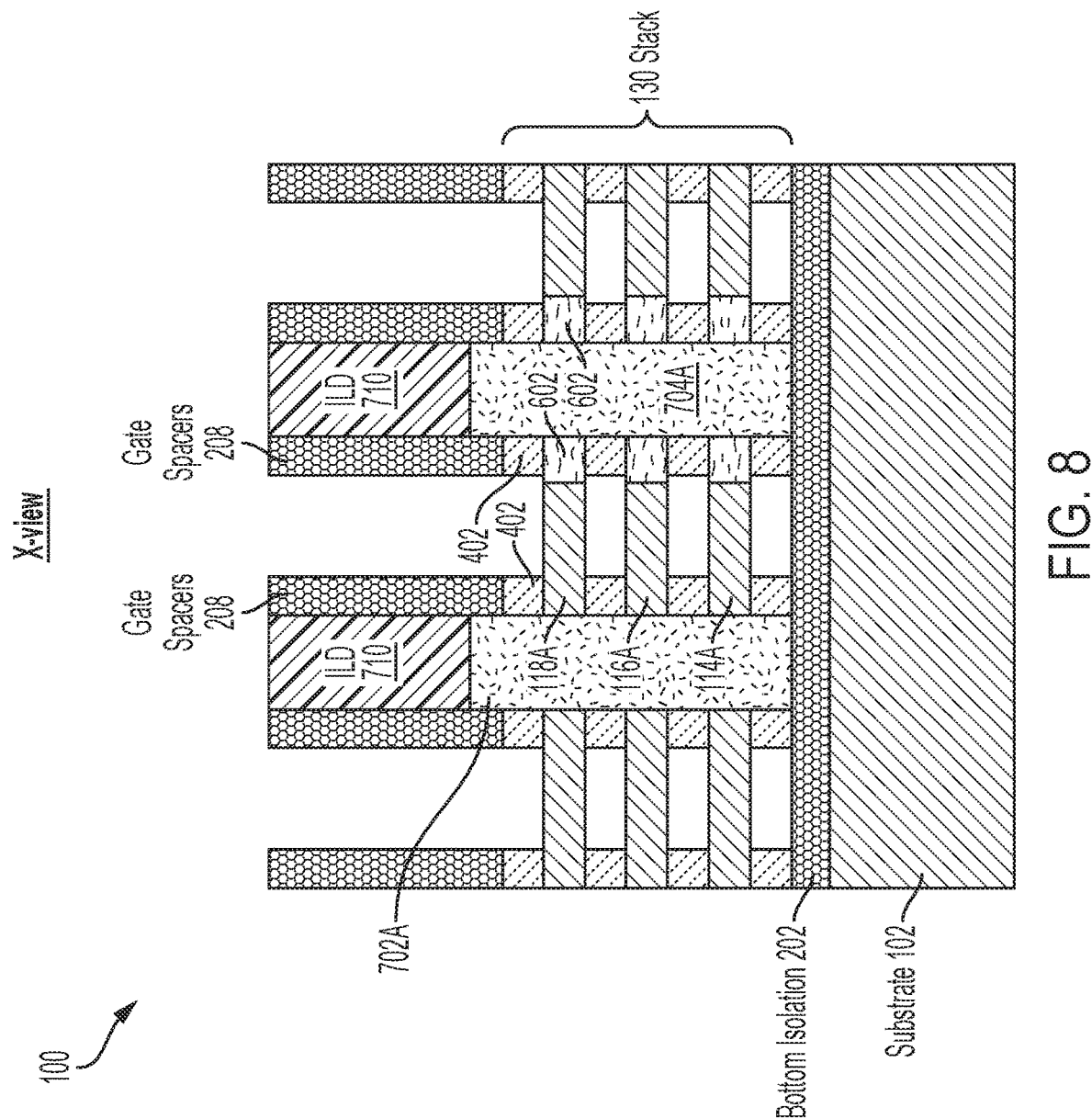
Figure 9:
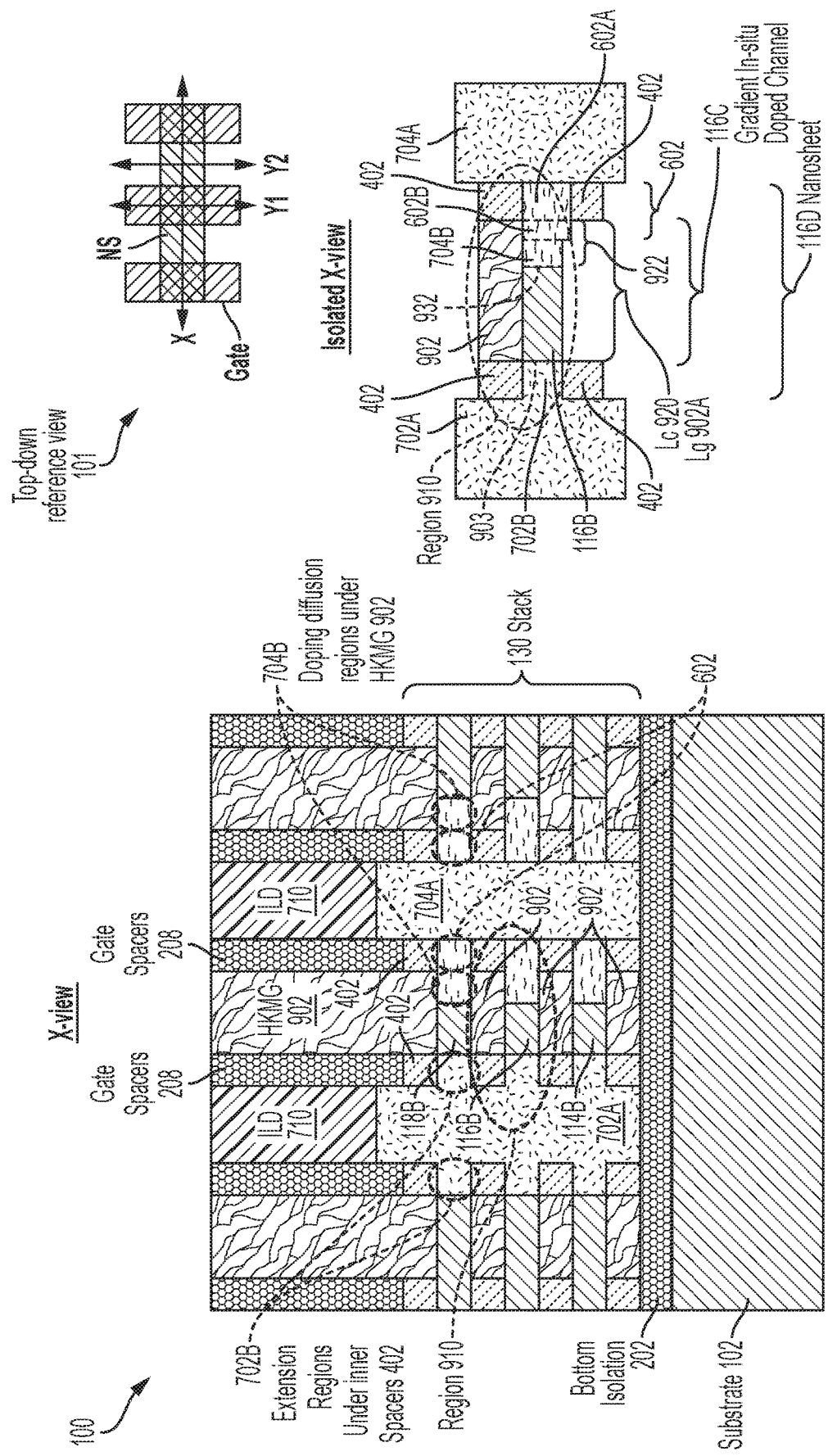

Turning now to a more detailed description of fabrication operations and resulting structures according to aspects of the invention, FIGS. 1-9 depict a nanosheet-based structure 100 after various fabrication operations for forming nanosheet FETs having source-side channel doping that creates a gradient doping concentration and a gradient Vt level along gradient in-situ doped channels (e.g., gradient in-situ doped channel region 116C shown in the isolated X-view of region 910 of FIG. 9) of the nanosheet-based structure 100. For ease of illustration, the fabrication operations depicted in FIGS. 1-9 will be described in the context of forming 1-3 nanosheet stacks 130 (shown in FIGS. 1 and 8). It is intended, however, that fabrication operations described herein apply equally to the fabrication of any number of the nanosheet stacks 130.

Although the cross-sectional diagrams depicted in FIGS. 1-9 are two-dimensional, it is understood that the diagrams depicted in FIGS. 1-9 represent three-dimensional structures. To assist with visualizing the three-dimensional features, the top-down reference diagram 101 shown in FIG. 1 provides a reference point for the various cross-sectional views (X-view, Y1-view, and Y2-view) shown in FIGS. 1-9 and 10-20. The X-view is a side view taken across the three gates, the Y1-view is an end view taken through the active gate, and the Y2-view is an end view taken through a portion of the nanosheet (NS) stack where one of the S/D regions is (or will be) formed.

FIG. 1 depicts cross-sectional views of the nanosheet-based structure 100 after initial fabrication operations in accordance with aspects of the present invention. As shown in FIG. 1, the nanosheet stack 130 is formed over the substrate 102. The nanosheet stack 130 includes an alternating series of SiGe sacrificial nanosheet layers 120, 122, 124, 126, 128 and Si nanosheet layers 114, 116, 118. In accordance with aspects of the invention, the alternating nanosheet layers 120, 122, 114, 124, 116, 126, 118, 128 of the nanosheet stack 130 are formed by epitaxially growing one nanosheet layer then the next until the desired number and desired thicknesses of the nanosheet layers are achieved. A hard mask layer (not shown) is deposited over the alternating nanosheet layers 120, 122, 114, 124, 116, 126, 118, 128, and the hard mask layer and the alternating nanosheet layers 120, 122, 114, 124, 116, 126, 118, 128 are etched to define the nanosheet stack 130 and the sub-fin 102A of the substrate 102. The hard mask layer can be any suitable dielectric, including but not limited to SiN.

In embodiments of the invention, each of the nanosheet layers 120, 122, 114, 124, 116, 126, 118, 128 can have a vertical direction thickness in the range from about 5 nm to about 20 nm, in the range from about 10 nm to about 15 nm, or about 10 nm. Other vertical direction thicknesses are contemplated. Although eight alternating layers 120, 122, 114, 124, 116, 126, 118, 128 are depicted in the figures, any number of alternating layers can be provided.

Epitaxial materials can be grown from gaseous or liquid precursors using, for example, vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments of the invention, the SiGe sacrificial nanosheet layers 122, 124, 126, 128 can be about SiGe 25%. The notation "SiGe 25%" is used to indicate that 25% of the SiGe material is Ge and 75% of the SiGe material is Si. In some embodiments of the invention, the Ge percentage in the SiGe sacrificial nanosheet layers 122, 124, 126, 128 can be any value, including, for example a value within the range from about 20% to about 45%.

In embodiments of the invention, the SiGe sacrificial nanosheet layer 120 has a Ge percentage that is sufficiently greater than the Ge percentage in the SiGe sacrificial nanosheet layers 122, 124, 126, 128 to provide etch selectivity between the sacrificial nanosheet layer 120 and the sacrificial nanosheet layers 122, 124, 126, 128. In some aspects of the invention, the Ge percentage in the SiGe sacrificial nanosheet layer 120 is above about 60%. In some aspects of the invention, the sacrificial nanosheet layers 122, 124, 126, 128 can be SiGe 25%, and the sacrificial nanosheet layer 120 can be at or above about SiGe 60%.

Figure 2:
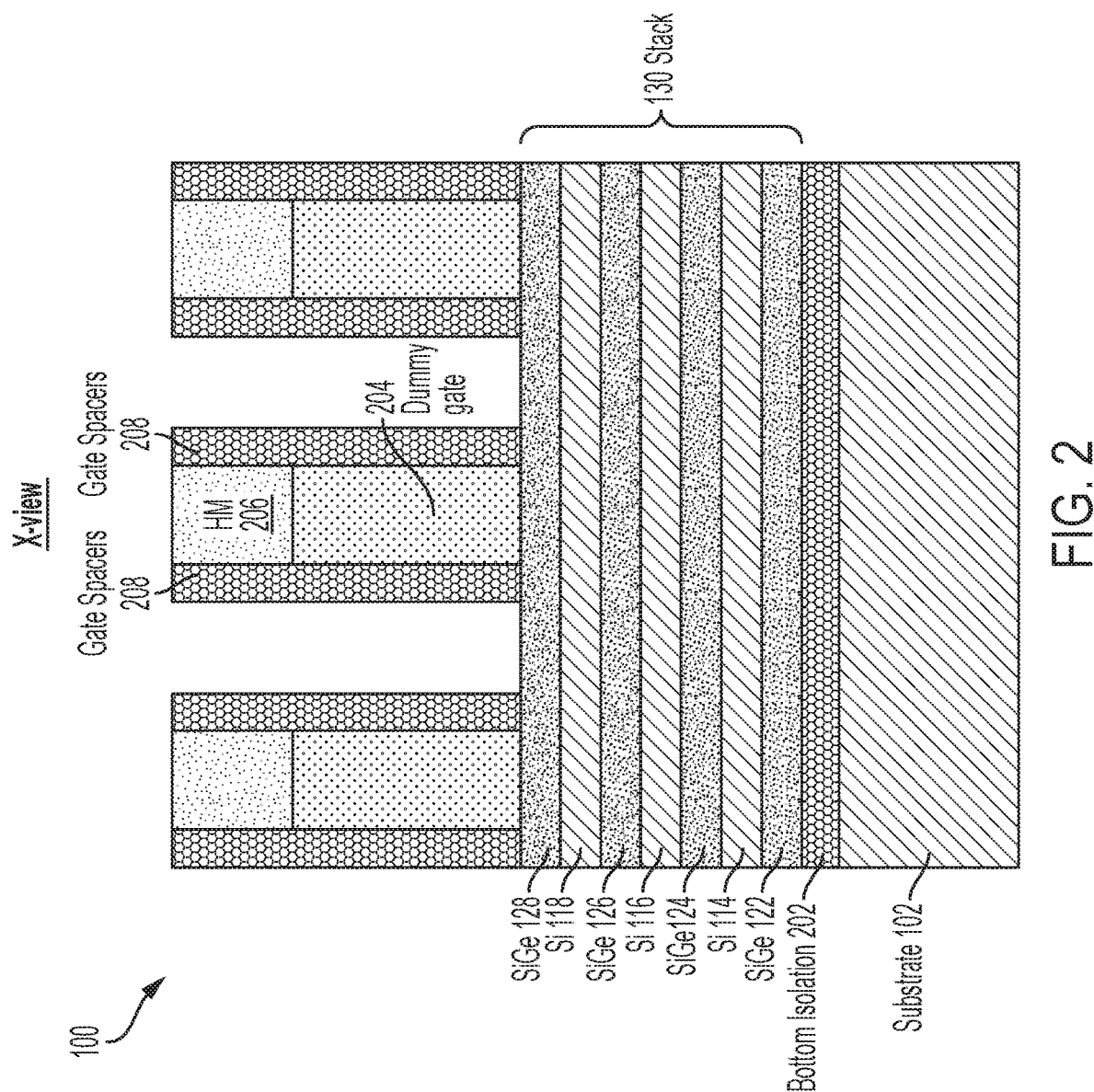

In FIG. 2, known fabrication operations have been used to selectively remove the sacrificial nanosheet layer 120 and replace it with a bottom isolation region 202. In embodiments of the invention, the dielectric material used to form the bottom isolation region 202 can include silicon oxide, silicon nitride, silicon oxynitride, SiBCN, SiOCN, SiOC, or any suitable combination of those materials.

Referring still to FIG. 2, known fabrication operations have been used to, prior to formation of dummy gates 204, deposit a thin layer of gate oxide (not shown separately) over the nanosheet stack 130. In FIG. 2, the dummy gate 204 represents the combination of the thin layer of gate oxide (e.g., $SiO_2$) and a material (e.g., amorphous silicon (a-Si)) from which the dummy gates 204 are formed. In some embodiments of the invention, the gate oxide can be a so-called "extended gate" (EG) oxide. In order to increase the maximum gate voltage (e.g., Vt) that can be applied to a final version of the nanosheet-based (or FIN-based) structure 100, the volume of the final gate (e.g., the high-k metal gate (HKMG) 902 shown in FIG. 9) can be increased, and the volume/thickness of the gate oxide can be increased. Accordingly, gate oxides that have been increased to accommodate a relatively larger gate volume and maximum Vt are referred to as EG oxides.

Referring still to FIG. 2, known fabrication operations (e.g., an RIE) have been used to form dummy gates 204. In embodiments of the invention, the dummy gates 204 can be formed by depositing and planarizing a layer of dummy gate material (not shown) over the gate oxide (not shown separately from the topmost SiGe sacrificial nanosheet 128). In some embodiments of the invention, the dummy gate material can be polycrystalline Si. In some embodiments of the invention, the dummy gate material can be amorphous Si (a-Si). After being deposited, the dummy gate material is planarized (e.g., by CMP) to a desired level. Known semiconductor fabrication operations are used to form patterned/etched hard masks 206 on a top surface of the planarized dummy gate material. The pattern used to form the hard masks 206 defines the footprints of the dummy gates 204 and the gate oxide. In embodiments of the invention, the hard masks 206 can be formed from oxide and/or nitride materials. In embodiments of the invention, the hard masks 206 can be formed by depositing a layer of hard mask material and patterning then etching the deposited hard mask layer to form the hard masks 206. The dummy gate material is selectively etched such that portions of the dummy gate material that are not under the hard masks 206 are selectively removed, thereby forming the dummy gates 204 over the gate oxide and the nanosheet stack 130.

Referring still to FIG. 2, known fabrication operations have been used to selectively remove the portions of the gate oxide that are not under the dummy gates 204, and a DHF cleaning has been performed to ensure that all of the gate oxide that is not under the dummy gates 204 has been removed.

Referring still to FIG. 2, known fabrication operations have been used to remove the bottommost SiGe 60% sacrificial nanosheet layer 120, followed by depositing dielectric material used to form offset gate spacers 208 on sidewalls of the dummy gates 204, and used to form bottom isolation region 202 in the space that was occupied by the removed sacrificial nanosheet layer 120. In embodiments of the invention, the offset gate spacers 208 can be formed by depositing the dielectric material (not shown) over the nanosheet-base structure 100 then directionally etching (e.g., using an RIE) the dielectric material to form the gate spacers 208. In some embodiments of the invention, the offset gate spacers 208 can be formed from any suitable dielectric material including, for example, silicon oxide, silicon nitride, silicon oxynitride, SiBCN, SiOCN, SiOC, or any suitable combination of those materials. In some embodiments of the invention, the offset gate spacers 208 can be a low-k dielectric material.

Figure 3:
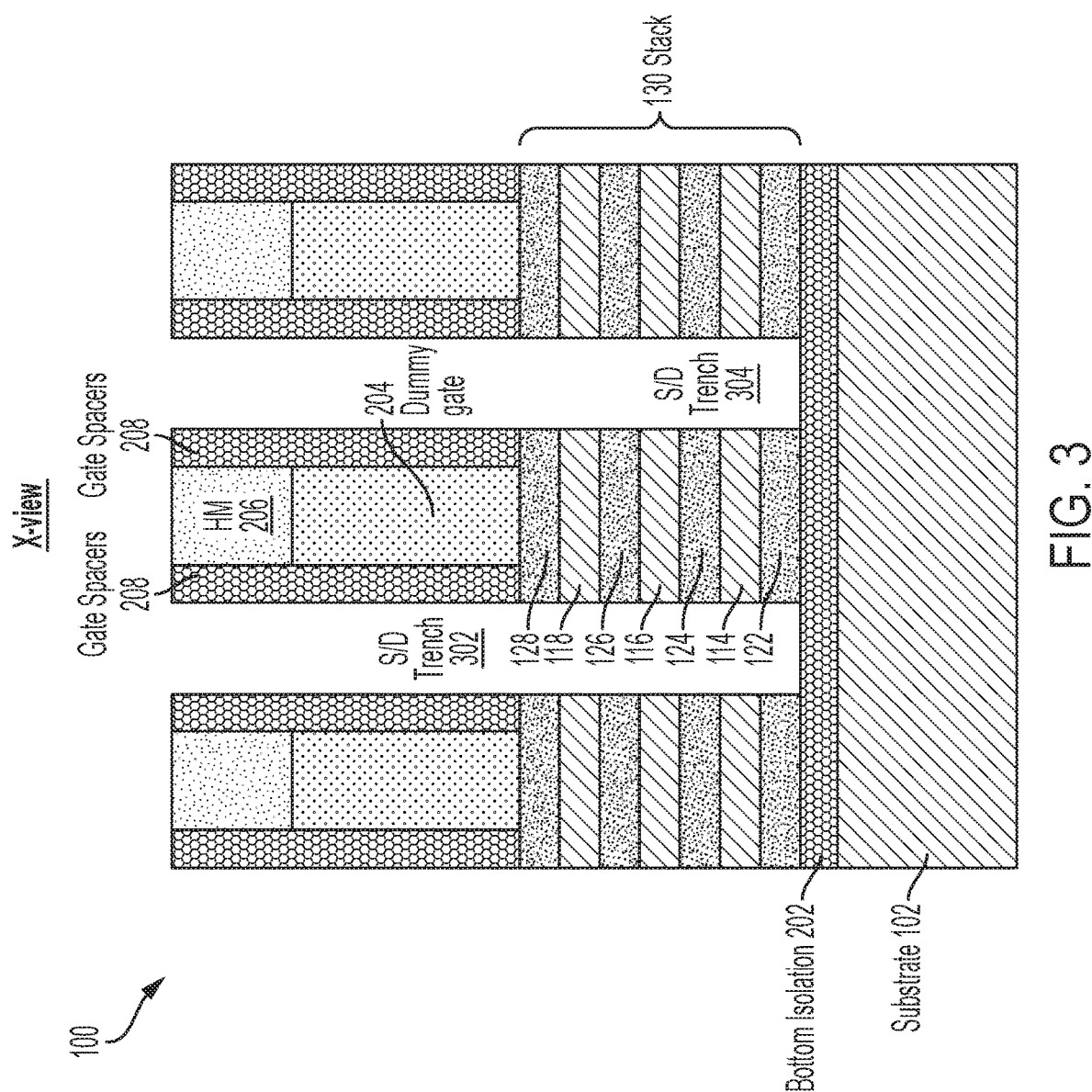

In FIG. 3, the portions of the nanosheet stack 130 that are not covered by the gate spacers 208 and the dummy gates 204 are etched, thereby forming multiple instances of the nanosheet stack 130; forming alternating layers of SiGe sacrificial nanosheets 122, 124, 126, 128 and Si nanosheets 114, 116, 118 in each instance of the nanosheet stacks 130; forming S/D trenches 302, 304; providing access to end regions of the SiGe sacrificial nanosheets 122, 124, 126, 128; and providing access to end regions of the Si nanosheets 114, 116, 118.

Figure 4:
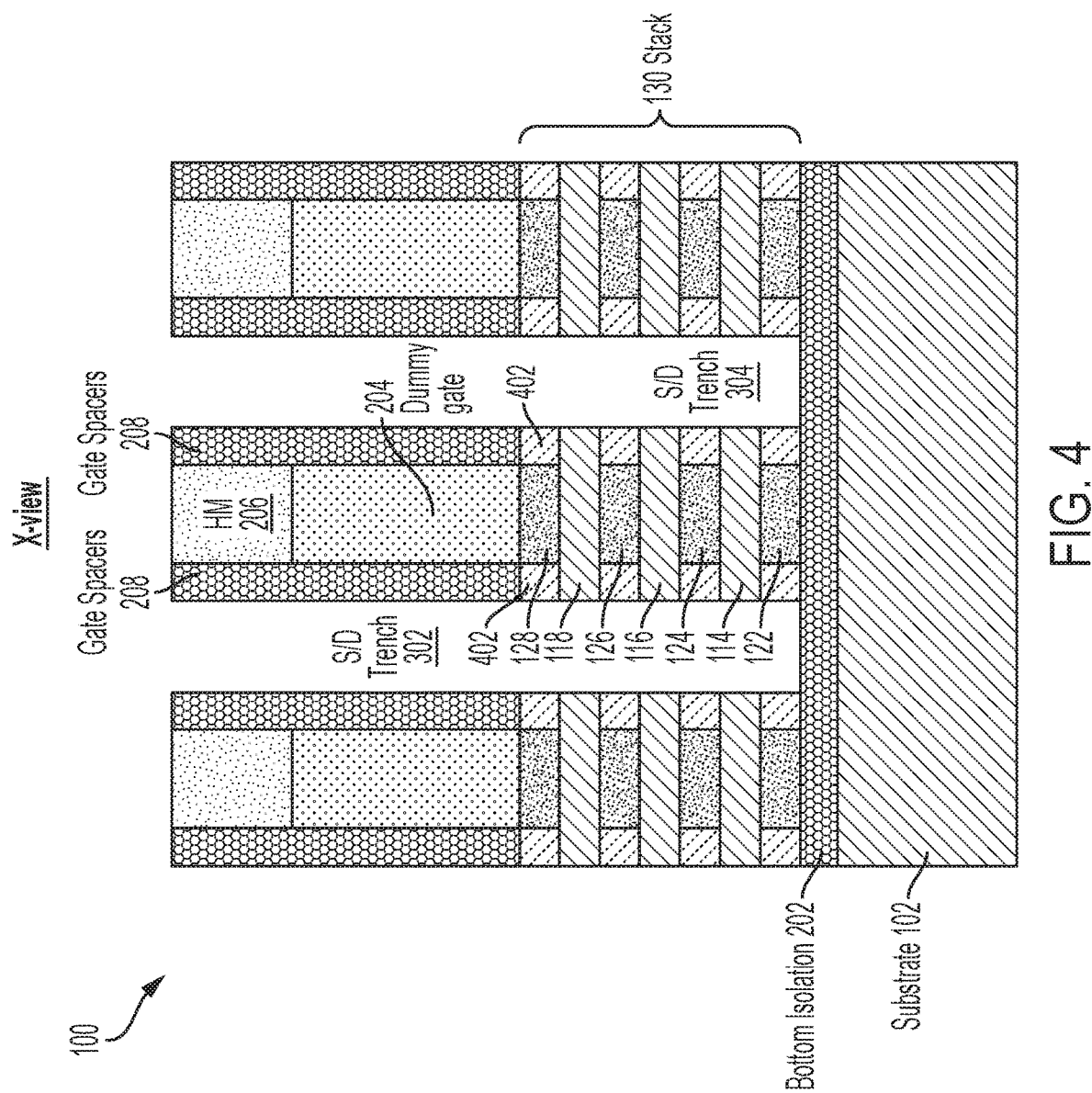

In FIG. 4, known semiconductor fabrication processes have been used to partially remove end regions of the SiGe sacrificial nanosheets 122, 124, 126, 128 to form end region or inner spacer cavities (not shown). In embodiments of the invention, the end regions of the SiGe sacrificial nanosheets 122, 124, 126, 128 can be removed using a so-called "pull-back" process to pull the SiGe sacrificial nanosheets 122, 124, 126, 128 back an initial pull-back distance such that the ends of the SiGe sacrificial nanosheets 122, 124, 126, 128 now terminate at about an inner edge of the gate spacers 208. In embodiments of the invention, the pull-back process leverages the fact that the sacrificial nanosheets 122, 124, 126, 128 are formed from SiGe, which can be selectively etched with respect to the Si nanosheets 114, 116, 118 using, for example, a vapor phase hydrogen chloride (HCL) gas isotropic etch process.

Referring still to FIG. 4, known semiconductor device fabrication processes have been used to form inner spacers 402 in the end region cavities (not shown) formed in the end regions of the sacrificial nanosheets 122, 124, 126, 128. In embodiments of the invention, the inner spacers 402 can be formed using, e.g., a conformal deposition process to deposit a dielectric over the end region cavities such that dielectric pinches off in the end region cavities to form the inner spacers 402. A subsequent isotropic or anisotropic etch back is performed to remove excess dielectric material on exposed vertical and horizontal surfaces of the structure 100. The inner spacers 402 can be silicon nitride, silicoboron carbonitride, silicon carbonitride, silicon carbon oxynitride, or any other type of dielectric material (e.g., a dielectric material having a dielectric constant k of less than about 5).

Figure 5:
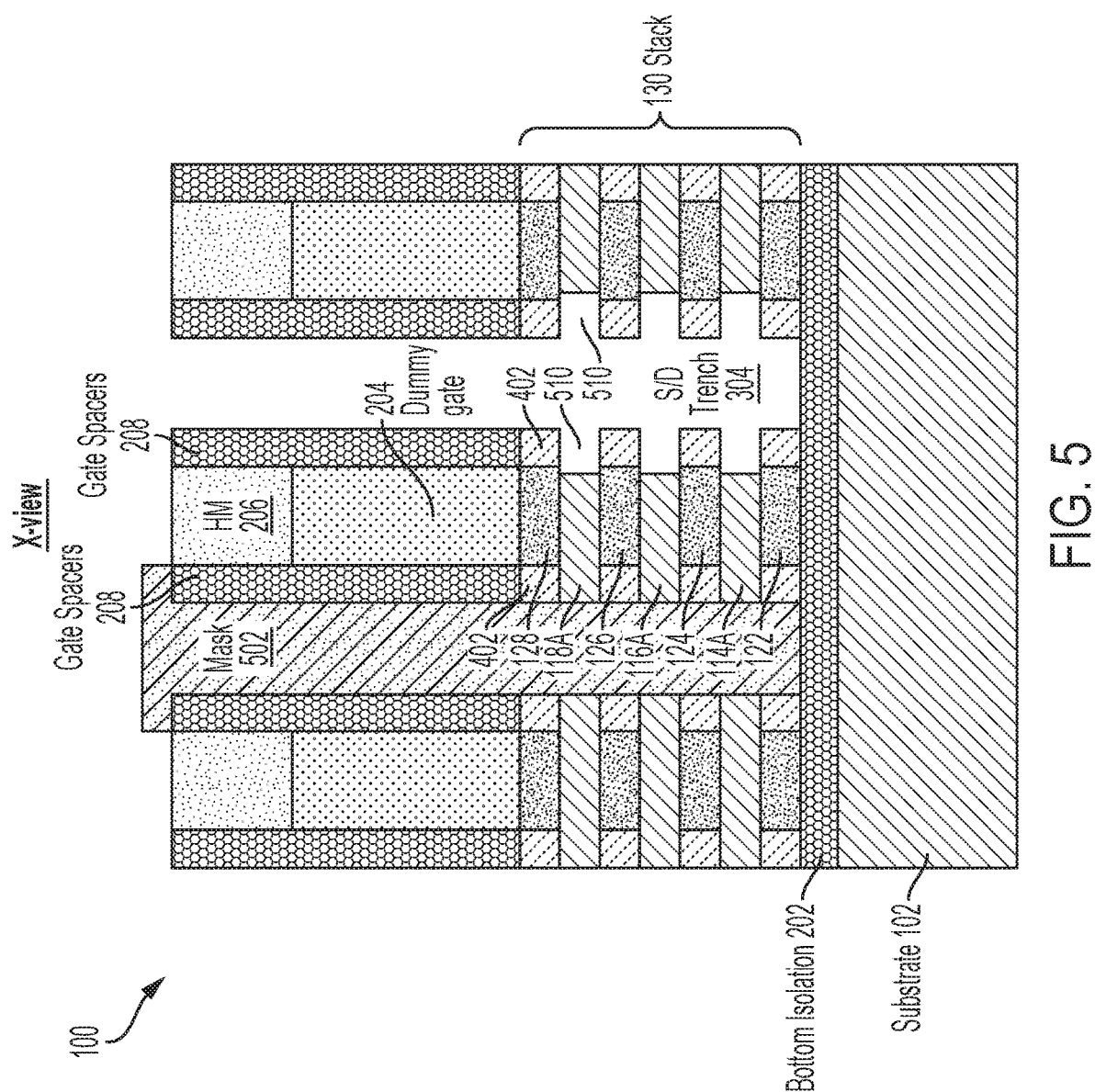

In FIG. 5, known fabrication operations have been used to form a mask region 502. In embodiments of the invention, the mask region 502 can be deposited within the S/D trench 302 (shown in FIG. 4) and recessed to a predetermined level as shown. In accordance with aspects of the invention, the mask region 502 protects the structures that define the S/D trench 302 from being impacted by downstream processing operations. In embodiments of the invention, the mask region 502 can be formed from any suitable material, including, for example, spin-on carbon (SOC) and/or organic planarization layers (OPL). In general, OPLs are used as etch masks for pattern transfers into inorganic substrates, to fill pre-existing features, and to planarize a substrate to allow for larger patterning process windows. While both SOC and OPL materials are generally suitable for the mask region 502, SOC is better suited to withstand a higher downstream thermal budget.

Referring still to FIG. 5, known fabrication operations have been used to partially remove source-side end regions of the Si nanosheets 114, 116, 118 (shown in FIG. 4) to form Si nanosheets 114A, 116A, 118A having source-side end region cavities 510. In embodiments of the invention, the source-side end regions of the Si nanosheets 114, 116, 118 can be removed using a so-called "pull-back" process to pull the Si nanosheets 114, 116, 118 back for a pull-back distance such that the Si nanosheets 114A, 116A, 118A are formed and source-side ends of the Si nanosheets 114A, 116A, 118A terminate at predetermined locations. In accordance with aspects of the invention, the predetermined locations of the pull-back distances of the source-side ends of the Si nanosheets 114A, 116A, 118A determine a horizontal length of source-side in-situ doped regions 602 (shown in FIG. 6) that will be formed in the source-side end region cavities 510. In accordance with aspects of the invention, the predetermined locations of the pull-back distances on the source-side ends of the Si nanosheets 114A, 116A, 118A are selected based a variety of factors, including but not limited to the desired gradient doping characteristics and gradient Vt level characteristics that will be created in the final nanosheet structure 116D (shown in the isolated X-view of a region 910 show in FIG. 9) and the final gradient in-situ doped channel region 116C (shown in the isolated X-view of a region 910 show in FIG. 9). Additional details of the final nanosheet structure 116D and the final gradient in-situ doped channel region 116C are described in connection with the description of nanosheet structure 100 shown in FIG. 9. In embodiments of the invention, the pull-back process leverages the fact that the Si nanosheets 114A, 116A, 118A are formed from Si, which can be selectively etched with respect to the SiGe sacrificial nanosheets 122, 124, 126, 128 using, for example, a vapor phase hydrogen chloride (HCL) gas isotropic etch process.

Figure 6:
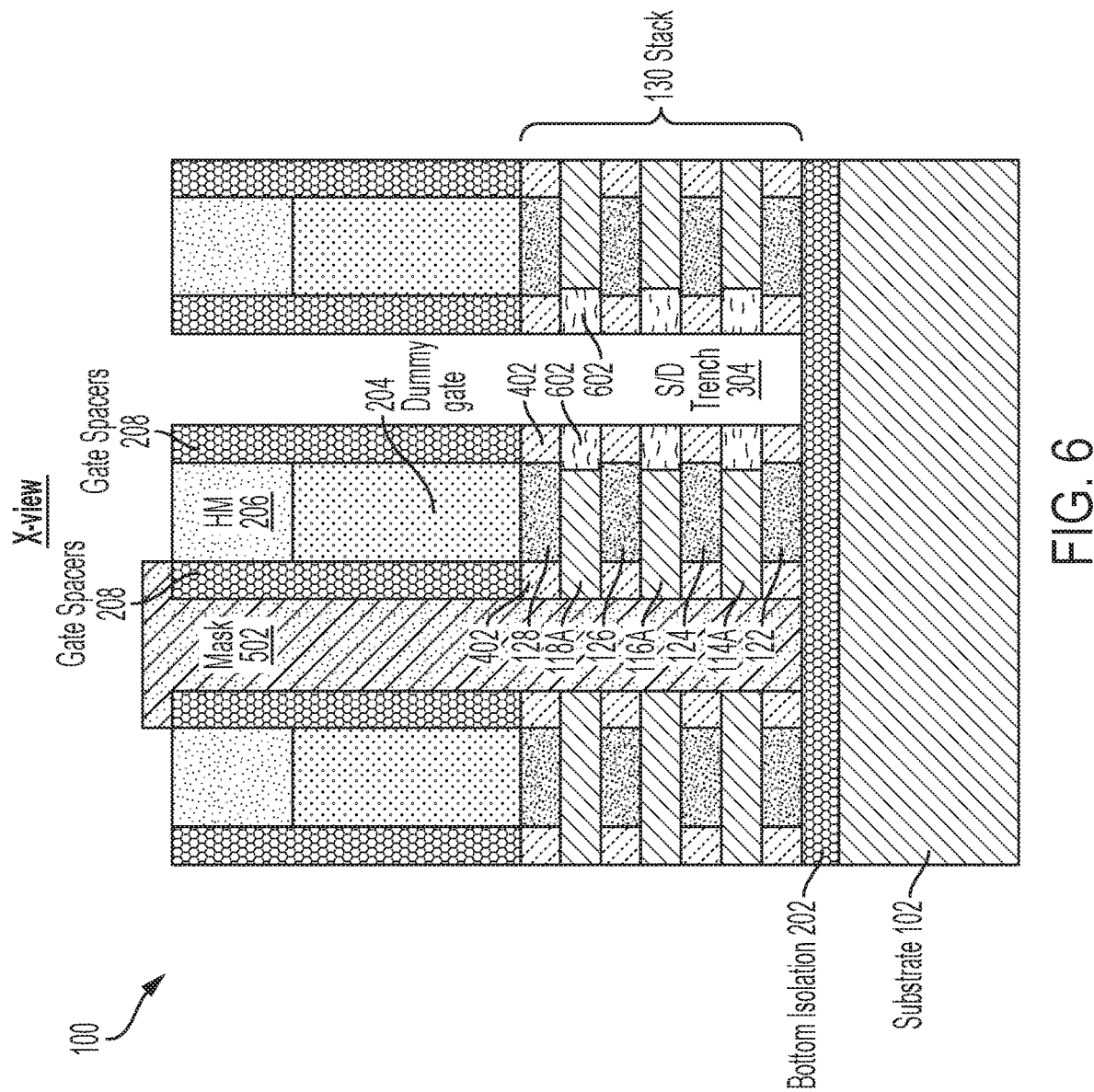

In FIG. 6, known semiconductor device fabrication processes have been used to form source-side in-situ doped regions 602 in a manner that fills the source-side end region cavities 510 (shown in FIG. 5). In embodiments of the invention, the source-side in-situ doped regions 602 can be formed by epitaxially growing the source-side in-situ doped regions 602 from the exposed ends of the Si nanosheets 114A, 116A, 118A using, e.g., an epitaxial growth process with in-situ doping. In accordance with aspects of the invention, the source-side in-situ doped regions 602 can be doped Si or doped SiGe. In the embodiments of the invention depicted in FIG. 6, the source-side in-situ doped regions 602 are doped Si. The size of each source-side in-situ doped region 602 corresponds to the vertical thickness of its corresponding Si nanosheet 114A, 116A, 118A and the pull-back distance used to form the corresponding source-side end region cavity 510. In accordance with aspects of the invention, the doping concentration level in each source-side in-situ doped region 602 is selected to achieve a desired doping concentration gradient and Vt gradient in the final nanosheet structure 116D (shown in the isolated X-view of a region 910 show in FIG. 9) and the final gradient in-situ doped channel region 116C (shown in the isolated X-view of a region 910 show in FIG. 9). Additional details of the final nanosheet structure 116D and the final gradient in-situ doped channel region 116C are described in connection with the description of nanosheet structure 100 shown in FIG. 9. In embodiments of the invention, the dopant concentration in the source-side in-situ doped regions 602 can range from about $1\times10^{18}$ cm$^{-3}$ to about $1\times10^{21}$ cm$^{-3}$, or between about $1\times10^{19}$ cm$^{-3}$ and about $1\times10^{20}$ cm$^3$.

In FIG. 7, known fabrication operations have been used to form a doped drain region 702A and a doped source region 704A on exposed end regions of the source-side in-situ doped regions 602, thereby creating initial drain-side p/n junctions at the interfaces between the Si nanosheets 114A, 116A, 118A and the drain region 702A, and also forming initial source-side p/n junctions at the interfaces between the Si nanosheets 114A, 116A, 118A and the source-side in-situ doped regions 602. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p/n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

In embodiments of the invention, the initial drain-side p/n junctions and the initial source-side p/n junctions are moved horizontally a predetermined distance by exposing the structure 100 to one or more temperatures (or ranges of temperatures) for predetermined times and temperatures that are sufficient to cause the dopants in the drain region 702A to diffuse into the drain-side of the Si nanosheets 114A, 116A, 118A, and that are sufficient to further cause dopants in the source-side in-situ doped region 602 to diffuse into the source-side of the Si nanosheets 114A, 116A, 118A. In some aspects of the invention, the above-described times and temperatures result from processes that are used to form the S/D regions 702A, 704A. In some aspects of the invention, the above-described times and temperatures also result from dopant drive-in processes that are applied subsequent to forming the S/D regions 702A, 704A. In some aspects of the invention, the dopant drive-in processes are applied subsequent to the fabrication operations depicted in FIG. 8. In some aspects of the invention, the dopant drive-in processes are applied subsequent to the fabrication operations depicted in FIG. 8 but before the fabrication operations for forming the HKMG 902 (shown in FIG. 9). In some aspects of the invention, the dopant drive-in processes are applied subsequent to the fabrication operations for forming the HKMG 902.

The doped drain region 702A and the doped source region 704A can be formed by a variety of methods, such as, for example, epitaxy; ultrahigh vacuum chemical vapor deposition (UHVCVD); rapid thermal chemical vapor deposition (RTCVD); metal organic chemical vapor deposition (MOCVD); low-pressure chemical vapor deposition (LPCVD); limited reaction processing CVD (LRPCVD); and MBE. In embodiments of the invention, the doped S/D regions 702A, 704A can be doped during deposition (e.g., in-situ doped) by adding dopants such as n-type dopants (e.g., phosphorus or arsenic) or p-type dopants (e.g., Ga, B, BF$_2$, or Al) during the above-described methods of forming the doped drain region 702A and the doped source region 704A. To reduce S/D contact resistance, the doped S/D regions 702A, 704A can be highly doped (e.g., doping levels from about $1\times10^{20}$ cm$^{-3}$ to about $1\times10^{21}$ cm$^{-3}$ and can be formed from $Si_{1-x}Ge_x$ having a higher Ge % (e.g., Ge %≥about 50%). In embodiments of the invention, the Ge % in the $Si_{1-x}Ge_x$ embodiments of the S/D regions 702A, 704A can be selected to maximize the dopant solubility in the $Si_{1-x}Ge_x$ S/D regions 702A, 704A. For example, it is generally accepted that a Ge % that can maximize the B solubility in $Si_{1-x}Ge_x$ embodiments of the S/D regions 702A, 704A is a Ge %≥about 65%. In embodiments of the invention, the dopant concentration in the drain region 702A and the source region 704A, respectively, can range from about $1\times10^{19}$ cm$^{-3}$ to about $2\times10^{21}$ cm$^{-3}$, or between about $2\times10^{20}$ cm$^3$ and about $1\times10^{21}$ cm$^{-3}$. Accordingly, in embodiments of the invention, the doping level in the in-situ doped regions 602 is less than the doping level in the source region 704A.

Referring still to FIG. 7, known semiconductor fabrication operations have been used to deposit an interlayer dielectric (ILD) material over the nanosheet-based structure 100 to fill in the remaining spaces of the structure 100. The structure 100 is planarized to the level shown in FIG. 7, thereby removing the hard masks 206 (shown in FIG. 6) and forming the ILD regions 710. In aspects of the invention, the ILD regions 710 can be formed from a low-k dielectric (e.g., k less than about 4) and/or an ultra-low-k (ULK) dielectric (e.g., k less than about 2.5).

In FIG. 8, known fabrication operations have been used to remove the sacrificial nanosheets 122, 124, 126, 128 (shown in FIG. 7) and the dummy gates 204 (shown in FIG. 7). The dummy gates 204 and the gate dielectric (not shown) can be removed by suitable known etching processes, e.g., RIE or wet removal processes. Known semiconductor fabrication operations have also been used to remove the SiGe sacrificial nanosheets 122, 124, 126, 128 selective to the Si nanosheets 114A, 116A, 118A. In embodiments of the invention, because the sacrificial nanosheets 122, 124, 126, 128 are formed from SiGe, they can be selectively etched with respect to the Si nanosheets 114A, 116A, 118A using, for example, a vapor phase hydrogen chloride (HCL) gas isotropic etch process.

FIG. 9 depicts a cross-sectional view of the nanosheet-based structure 100 after additional fabrication operations in accordance with aspects of the invention. Additionally, FIG. 9 depicts an isolated X-view of a region 910 of the nanosheet-based structure 100. Region 910 depicts additional details of a nanosheet 116D, which, after the fabrication operations shown in FIG. 9, includes a drain-side extension region 702B, a substantially undoped channel 116B, a source-side extension region 704B, and an in-situ doped region 602. Although region 910 is depicted as being applied to one nanosheet, it applies equally to all of the nanosheets depicted in FIG. 9.

As shown in FIG. 9, known fabrication operations have been used to replace the removed sacrificial nanosheet layers 122, 124, 126, 128 (shown in FIG. 7) and the removed dummy gates 204 (show in FIG. 7) with a HKMG structure 902 having a dielectric layer (not shown separately) and a metal gate structure (not shown separately). The HKMG 902 surrounds the gradient in-situ doped channel regions (e.g., gradient in-situ doped channel region 116C shown in the isolated X-view of region 910) and regulates electron flow through the in-situ doped channels from the source region 704A to drain region 702A. The metal gate structure can include metal liners and work-function metals (WFM). In embodiments of the invention, the WFM can be, for example, TiN or TaN, and the metal gate structure can be aluminum or tungsten. The dielectric layer can include interfacial layers (IL) and high-k dielectric layers. In some embodiments of the invention, the high-k dielectric layers can modify the work function of the WFM. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

Referring still to FIG. 9, a dopant drive-in anneal (e.g., a rapid thermal anneal (RTA)) has been performed to activate and drive-in dopants from the drain region 702A into the drain-side of the substantially undoped Si nanosheets 114A, 116A, 118A (shown in FIG. 8), and from the source-side in-situ doped region 602 into the source-side of the substantially undoped Si nanosheets 114A, 116A, 118A (shown in FIG. 8), respectively. More specifically, when the dopant drive-in anneal drives dopants from the drain region 702A into drain-side ends of the Si nanosheets 114A, 116A, 118A, the anneal converts portions of the drain-side ends of the Si nanosheets 114A, 116A, 118A into the drain-side extension regions 702B. When the dopant drive-in anneal drives dopants from the source-side in-situ doped region 602 into the source-side of the Si nanosheets 114A, 116A, 118A, the anneal also converts portions of the source-side of the Si nanosheets 114A, 116A, 118A to source-side extension regions 704B. In accordance with aspects of the invention, the drain-side extension regions 702B act as extensions of the drain regions 702B, thereby shifting the drain-side junctions to form drain-side extension junctions 930 (shown in the isolated X-view of region 910) at the interfaces between the drain-side extension regions 702B and the drain-side of Si nanosheets 114B, 116B, 118B. In accordance with aspects of the invention, the source-side extension regions 704B act as extensions of the source-side in-situ doped region 602, thereby shifting the source-side junctions to form source-side extension junctions 932 (shown in the isolated X-view of region 910) at the interfaces between the source-side extension regions 704B and the source-side of the Si nanosheets 114B, 116B, 118B.

In accordance with embodiments of the invention, the locations of the extension junctions 930, 932 (shown in the isolated view of region 910) can be controlled through controlling the dopant drive-in anneals, which can be controlled through controlling and selecting a variety of anneal parameters, including, for example, the temperature and the duration of the anneal. In accordance with aspects of the invention, the dopant drive-in anneal used can be controlled such that the drain-side extension junctions 930 and the source-side extension junctions 932 over-lap but do not under-lap the HKMG 902. In other words, the dopant drive-in anneal used can be controlled such that the drain-side extension junctions 930 and the source-side extension junctions 932 are positioned under some portion of the HKMG 902.

The isolated X-view of the region 910 depicts additional details of how fabrication operations in accordance with aspects of the invention evolve the Si nanosheet 116 (shown in FIG. 3) to become the multi-segmented nanosheet 116D, which now includes the drain-side extension region 702B, the remaining substantially undoped Si nanosheet channel 116B, the source-side extension region 704B, an in-situ doped nanosheet channel region 602B, and an in-situ doped nanosheet region 602A. The portion of the multi-segmented nanosheet 116D that is under the HKMG 902 is the gradient in-situ doped channel region 116C, which includes the remaining substantially undoped Si nanosheet channel 116B, the source-side extension region 704B, and the in-situ doped nanosheet region 602B. The gradient in-situ doped channel region 116C has a channel length (Lc) 920, and a portion of Lc 920 is a gradient doped source-side Lc 922. The gradient doped source-side Lc 922 is formed from a bottom surface of the source-side extension region 704B and a bottom surface of the in-situ doped nano sheet region 602B. In embodiments of the invention, Lc 920 can range from about 12 nm to about 100 nm, although other values of Lc 920 are contemplated. In some aspects of the invention, the gradient doped source-side Lc 922 can range from about 20% to about 40% of Lc 920. The gate length (Lg) 902A is the length dimension of the portions of the HKMG 902 that are over the gradient in-situ doped channel 116C. In embodiments of the invention, the Lc 920 is substantially the same as the Lg 902A. Although the isolated X-view of the region 910 is depicted as being applied to one nanosheet, it applies equally to all of the nanosheets of the nanosheet-based structure 100 depicted in FIG. 9.

As previously noted in connection with the description of fabrication operations for forming the cavities 510 (shown in FIG. 5), the predetermined locations of the pull-back distances on the source-side of the Si nanosheets 114A, 116A, 118A (shown in FIG. 5) determine a horizontal length of the source-side in-situ doped regions 602 that have been formed in the source-side channel cavities 510. In accordance with aspects of the invention, the predetermined locations of the pull-back distances on the source-side of the Si channels 114A, 116A, 118A are selected based a variety of factors, including but not limited to the desired gradient doping characteristics and gradient Vt level characteristics in the gradient in-situ doped channel region 116C. In some embodiment of the invention, the horizontal length of each of the source-side in-situ doped regions 602 can terminate a drain-side of each of the source-side in-situ doped regions 602 at a variety of locations, including but not limited to under the inner spacers 402, at sidewalls of the inner spacers 402, and/or under the HKMG 902. In embodiments of the invention where the horizontal length of each of the source-side in-situ doped regions 602 terminates the drain-side of the source-side in-situ doped regions 602 under the HKMG 902, the source-side in-situ doped region 602 includes two sub-regions, namely an in-situ doped nanosheet region 602A and an in-situ doped nanosheet region 602B. In aspects of the invention, the in-situ doped nanosheet region 602B is the portion of the in-situ doped nano sheet region 602 that is positioned under the HKMG 902, and the in-situ doped nanosheet region 602A is the portion of the in-situ doped nanosheet region that not positioned under the HKMG 902. In some embodiments of the invention, the entire in-situ doped nanosheet region 602 is not under the HKMG 902, which results in there being no in-situ doped nanosheet region 602B, and further results in the in-situ doped nanosheet region 602 being substantially the same as the in-situ doped nanosheet region 602A.

Figure 18:
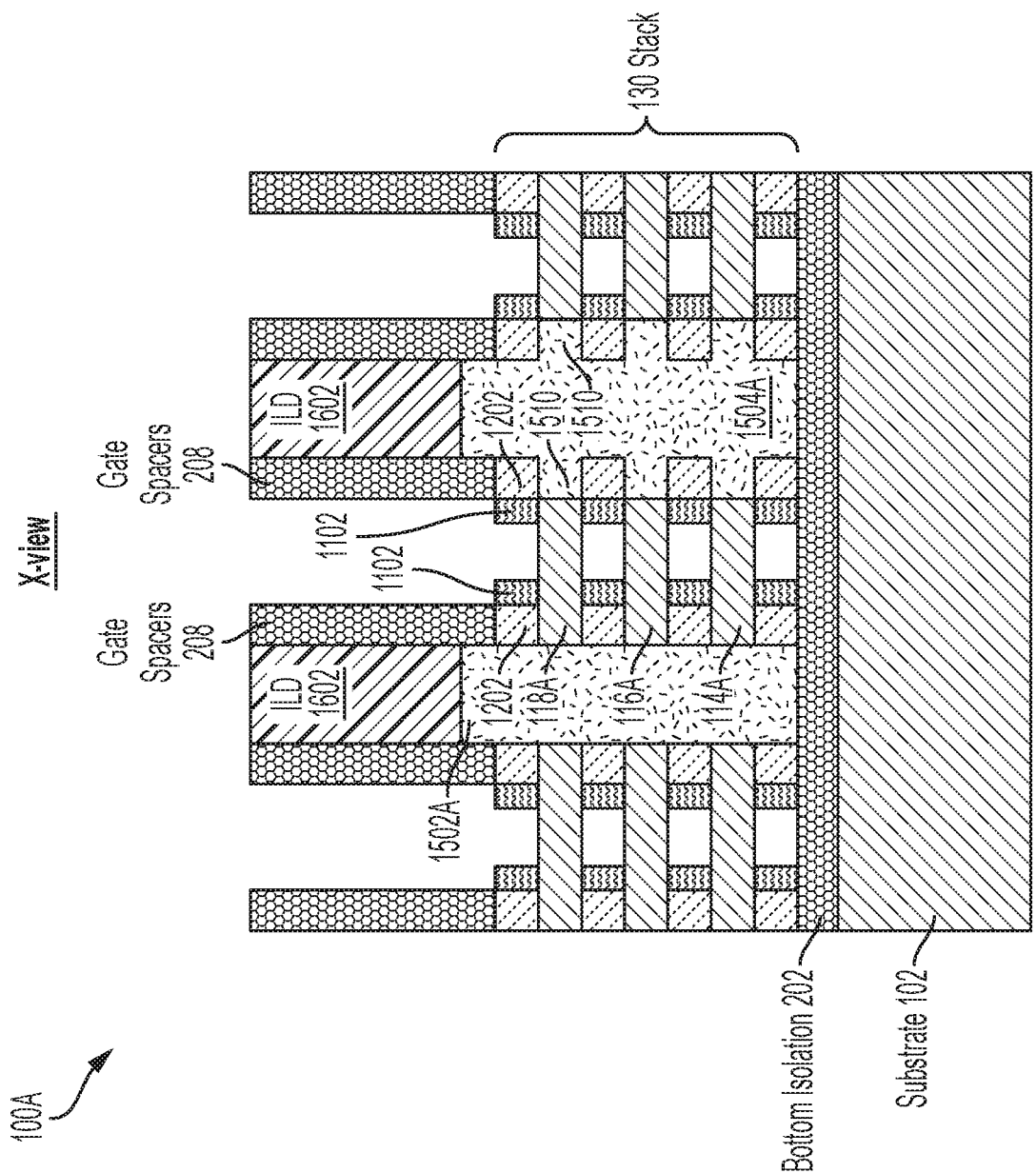
Figure 19:
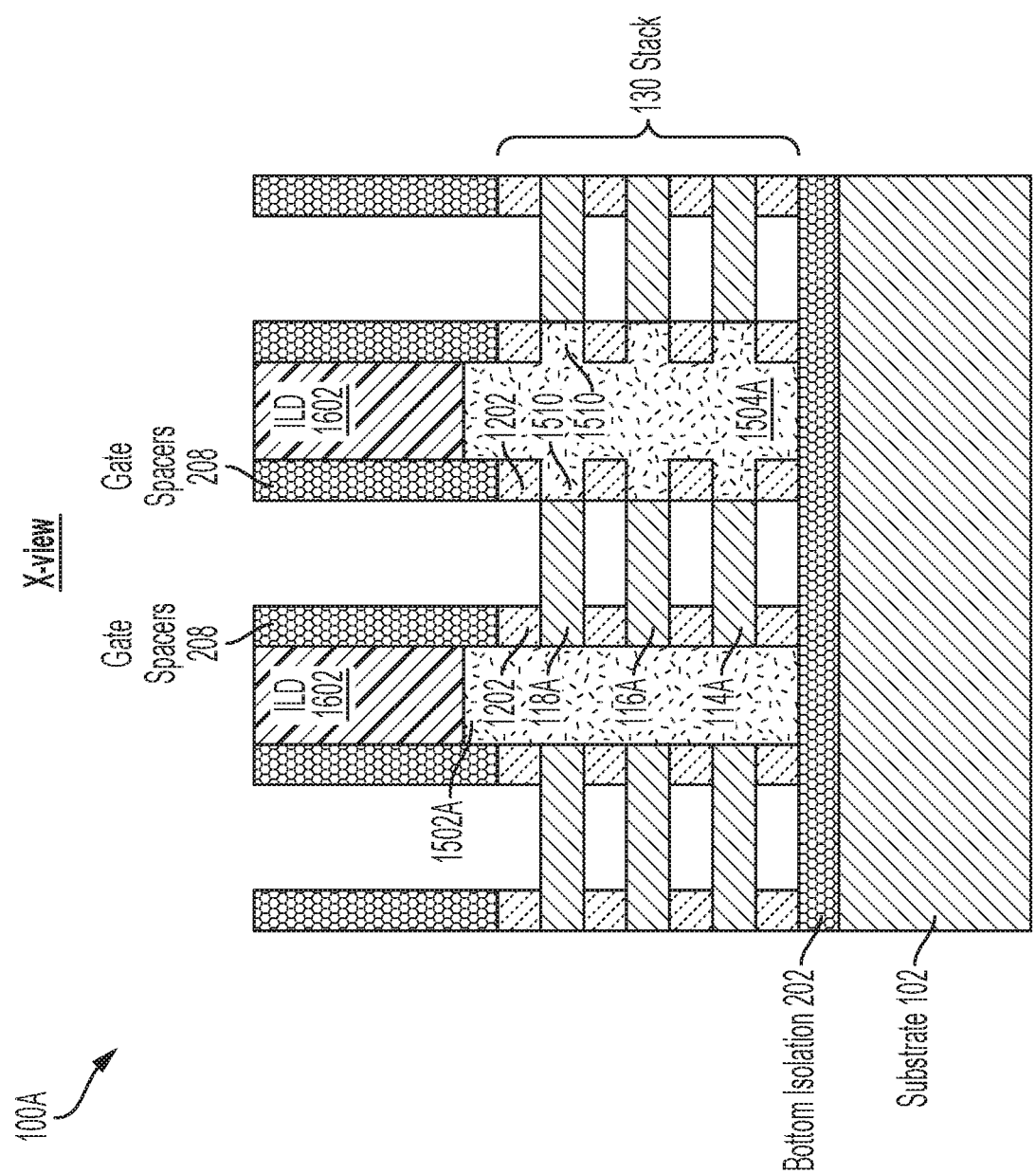
Figure 20:
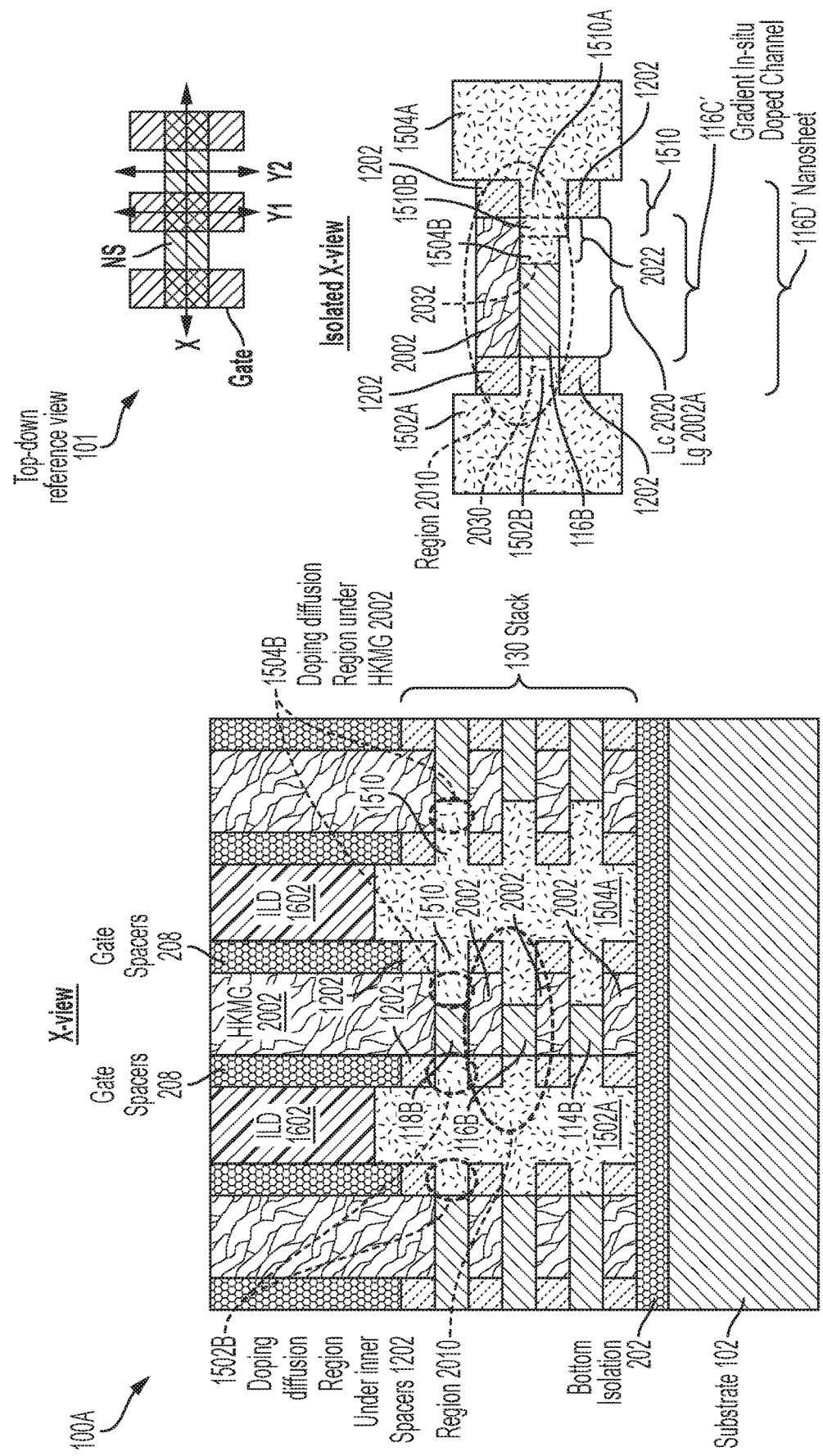

FIGS. 10-20 depict a nanosheet-based structure 100A after various fabrication operations for forming nanosheet FETs having source-side channel doping that creates a gradient doping concentration and a gradient Vt level along gradient in-situ doped channels (e.g., gradient in-situ doped channel region 116C' shown in the isolated X-view of region 2010 of FIG. 20) in accordance with aspects of the invention. The fabrication operations depicted in FIGS. 10-20 utilize the same initial fabrication operations that are depicted in FIGS. 1-3 and that were applied to the nanosheet-based structure 100. Because many of the fabrication operations shown in FIGS. 10-20 for forming the nanosheet-base structure 100A are substantially the same as the fabrication operations shown in FIGS. 4-9 for forming the nanosheet-base structure 100, many of the same reference numbers used in FIGS. 1-3 and 4-9 are used in FIGS. 10-20. For structures and/or spaces shown in FIGS. 1-3 and 4-9 having the same reference numbers as structures and/or spaces shown in FIGS. 10-20, the structures and/or spaces shown in FIGS. 10-20 have the same features (materials, fabrication method, functional characteristics, etc.) as the corresponding structures and/or spaces shown in FIGS. 1-3 and 4-9 unless otherwise specified. For structures and/or spaces shown in FIGS. 10-20 that, although having a different reference number, are substantially the same as corresponding structures and/or spaces shown in FIGS. 1-3 and 4-9, the structures and/or spaces shown in FIGS. 10-20 have all the same features (materials, fabrication method, functional characteristics, etc.) as the corresponding structures and/or spaces shown in FIGS. 1-3 and 4-9 unless otherwise specified.

Figure 10:
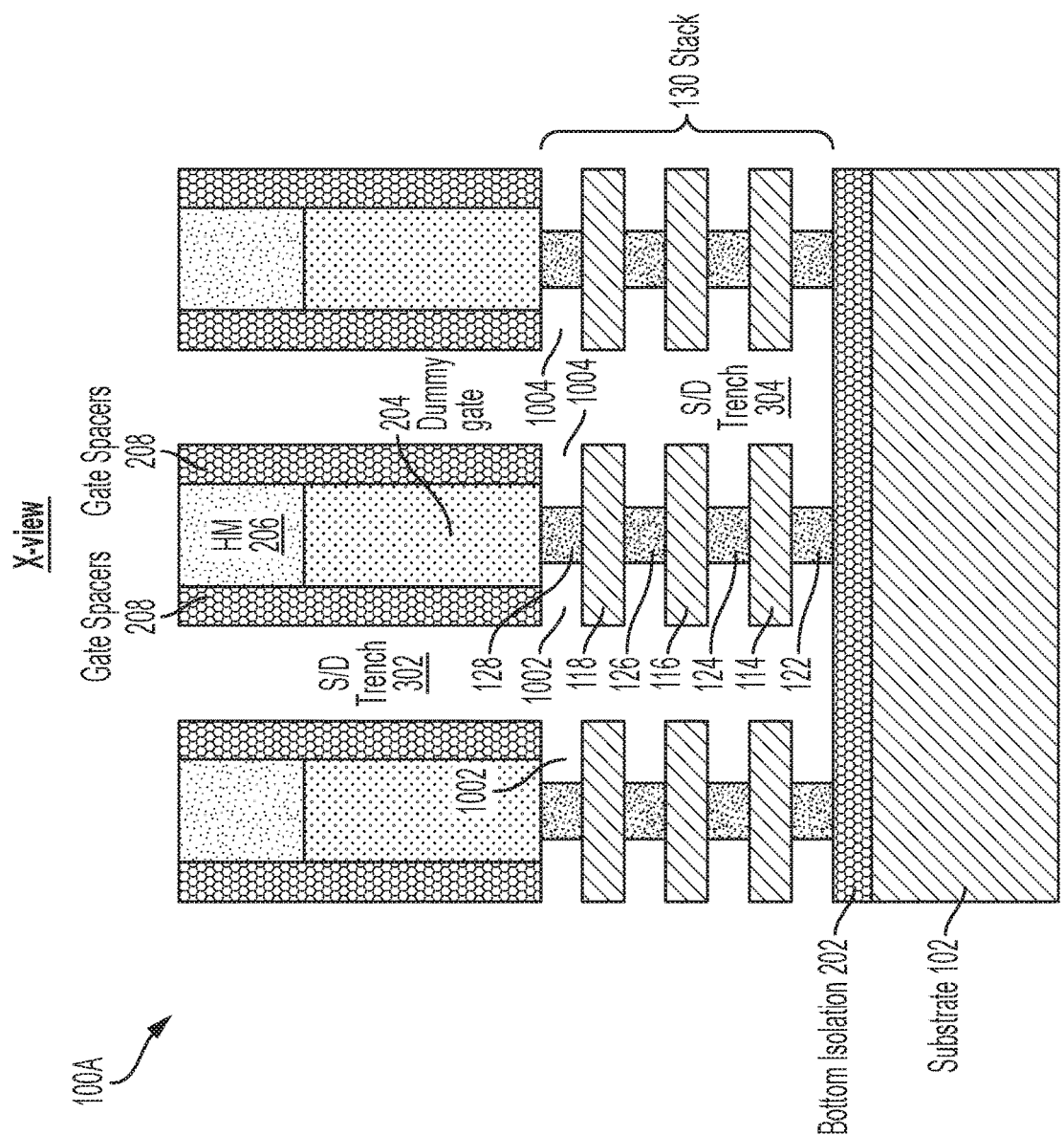

In FIG. 10, known semiconductor fabrication processes have been used to partially remove end regions of the sacrificial nanosheet regions 122, 124, 126, 128 to form end region or inner spacer cavities 1002. In embodiments of the invention, the end regions of the sacrificial nanosheets 122, 124, 126, 128 can be removed using a so-called "pull-back" process to pull the SiGe sacrificial nanosheet regions 122, 124, 126, 128 back an initial pull-back distance such that the ends of the sacrificial nanosheets 122, 124, 126, 128 now terminate underneath the dummy gates 204. In embodiments of the invention, the pull-back process leverages the fact that the sacrificial nanosheets 122, 124, 126, 128 are formed from SiGe, which can be selectively etched with respect to the Si nanosheets 114, 116, 118 using, for example, a vapor phase hydrogen chloride (HCL) gas isotropic etch process.

Figure 11:
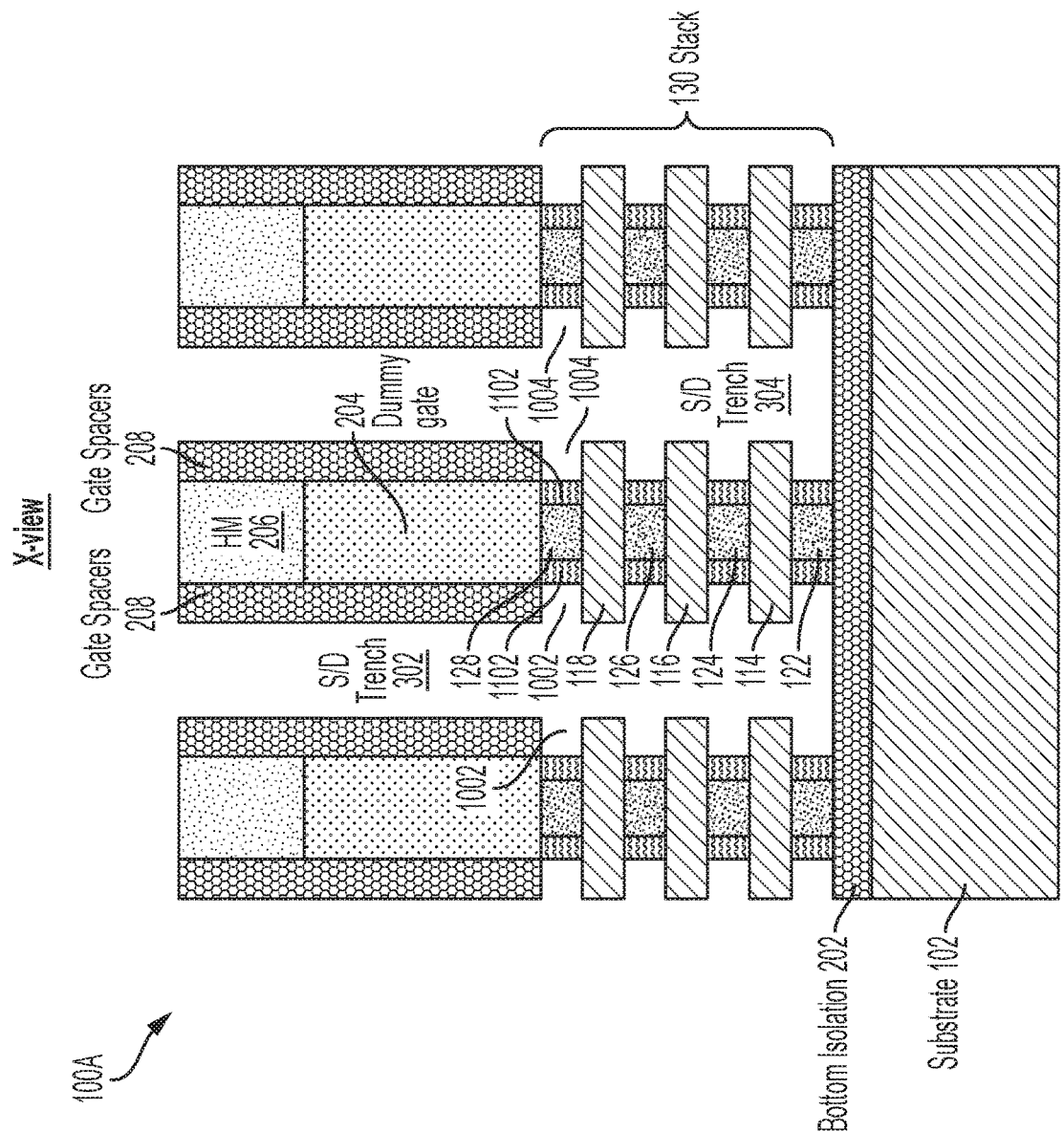

In FIG. 11, known semiconductor device fabrication processes (e.g., conformal deposition then etch back) have been used to form first inner spacers 1102 in a portion of the cavities 1002. In embodiments of the invention, the first inner spacers 1102 can be formed from an oxide material, including but not limited to $TiO_x$.

Figure 12:
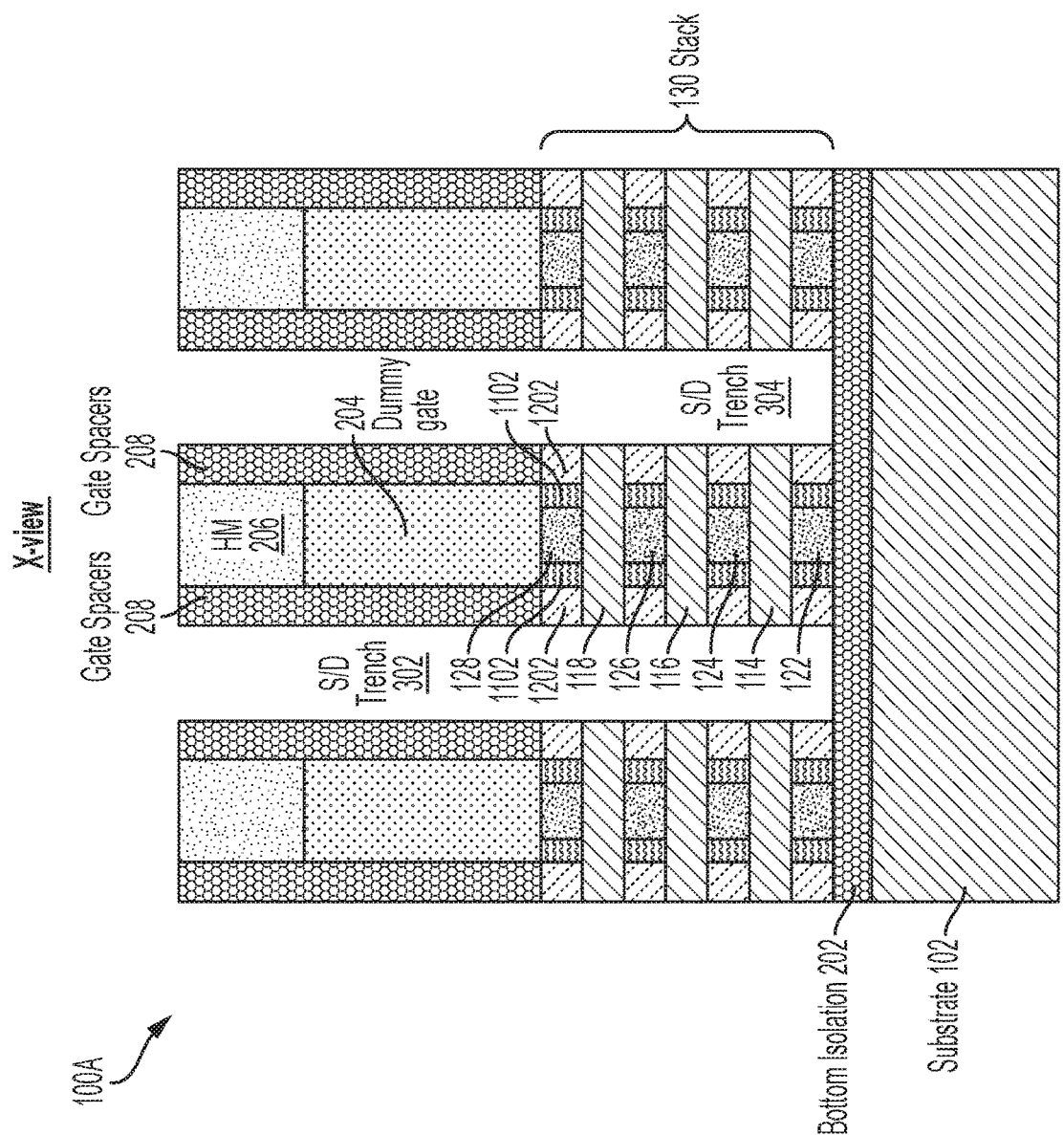

In FIG. 12, known semiconductor processes have been used to form second inner spacers 1202 in the remaining space of the cavities 1002 (shown in FIG. 11). In embodiments of the invention, the second inner spacers 402 can be formed using, e.g., a conformal deposition process to deposit a dielectric over the remaining space of the cavities 1002 such that dielectric pinches off in the remaining space of the cavities 1002 to form the second inner spacers 1202. A subsequent isotropic or anisotropic etch back is performed to remove excess dielectric material on exposed vertical and horizontal surfaces of the structure 100A. In some embodiment of the invention, the second inner spacers 1202 can terminate at about an inner edge of the gate spacers 208 and can be silicon nitride or a low-k nitride.

Figure 13:
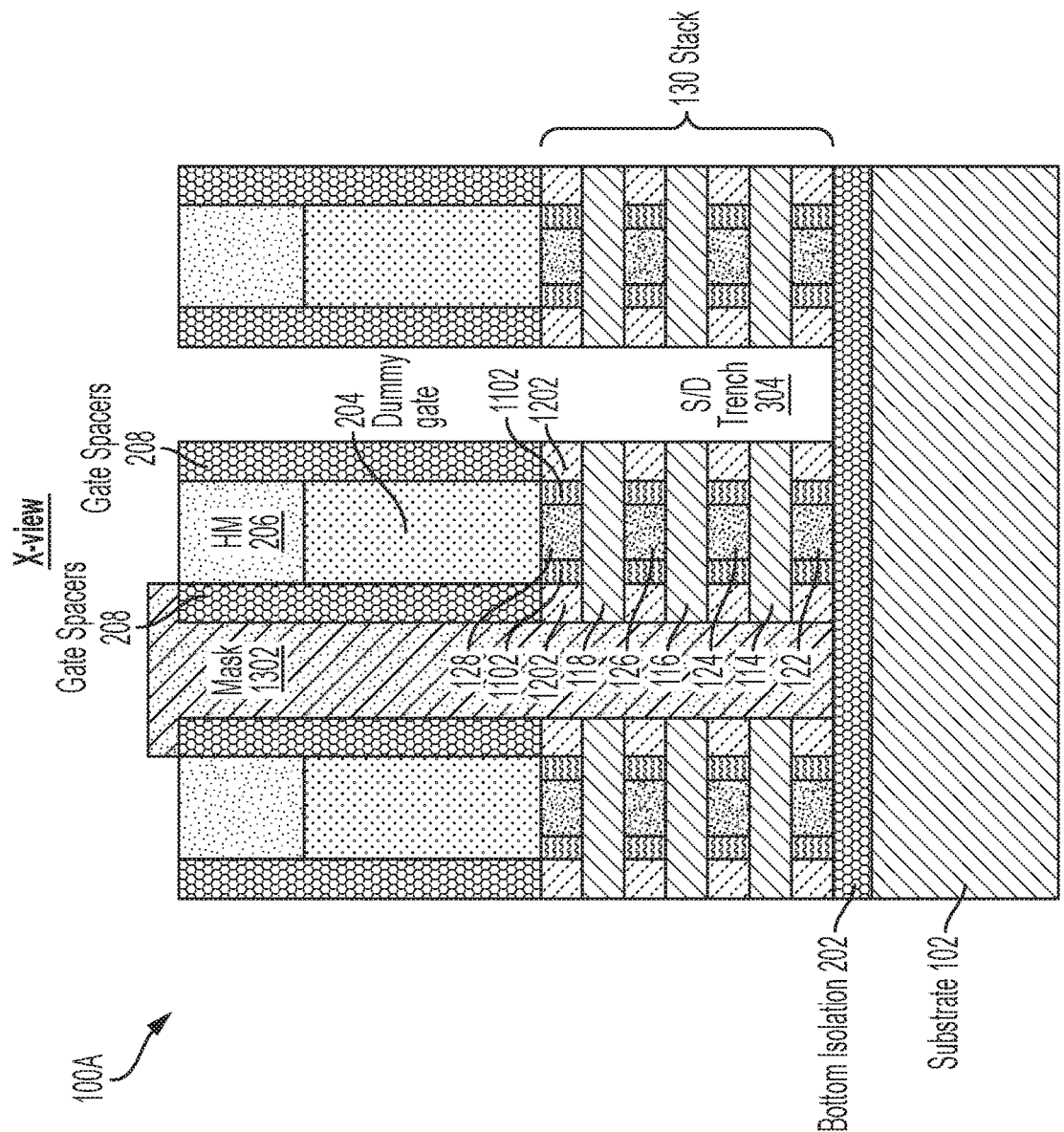

In FIG. 13, known fabrication operations have been used to form a mask region 1302. The mask region 1302 can be formed in the same manner and using the same considerations as the mask region 502 show in FIG. 5.

Figure 14:
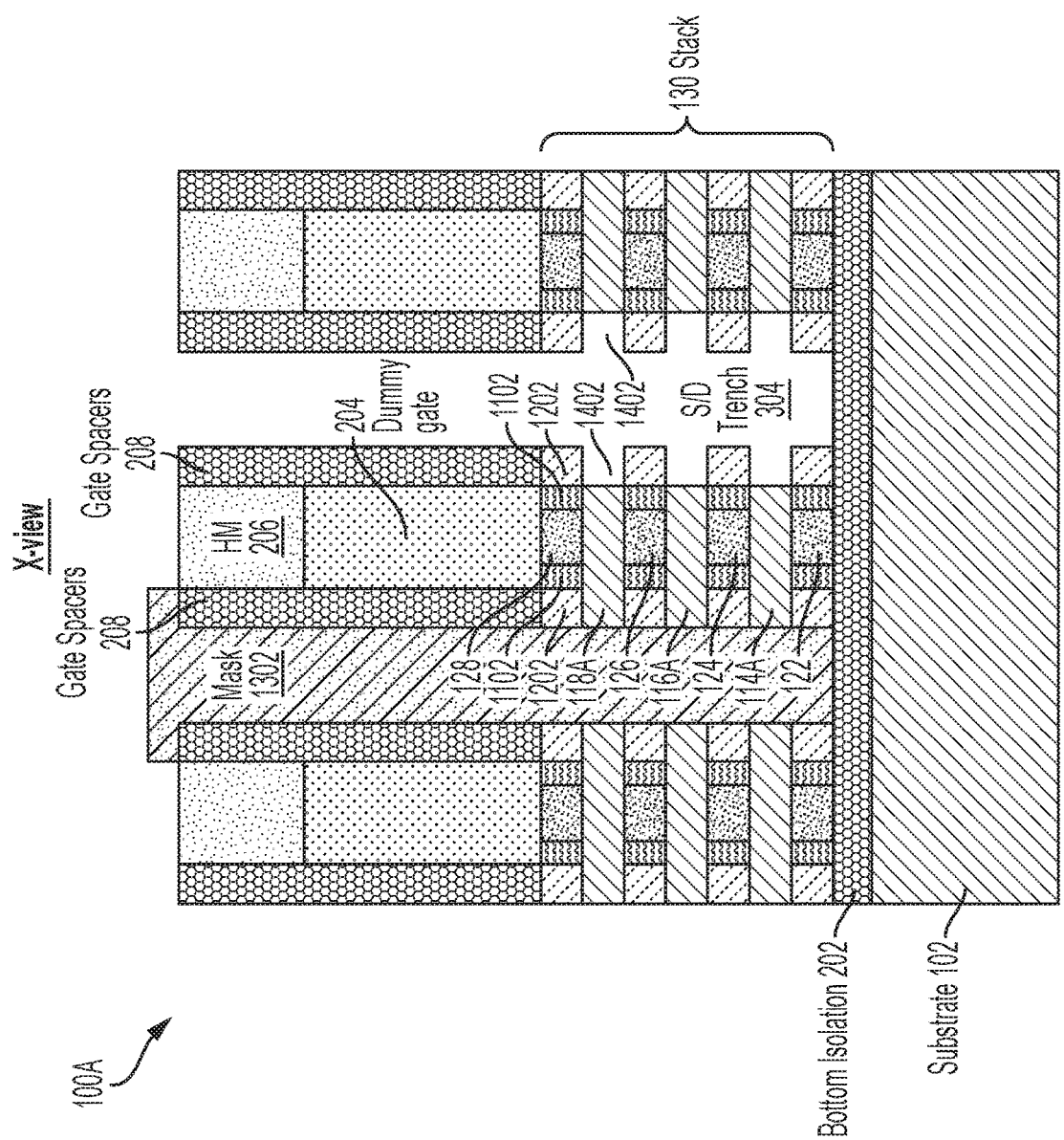

In FIG. 14, substantially the same fabrication operations described in connection with FIG. 5 have been used to partially remove source-side end regions of the Si nanosheets 114, 116, 118 (shown in FIG. 13) to form Si nanosheets 1114A, 116A, 118A and source-side end region cavities 1402. The end region cavities 1402 have substantially the same features as the cavities 510 (shown in FIG. 5).

Figure 15:
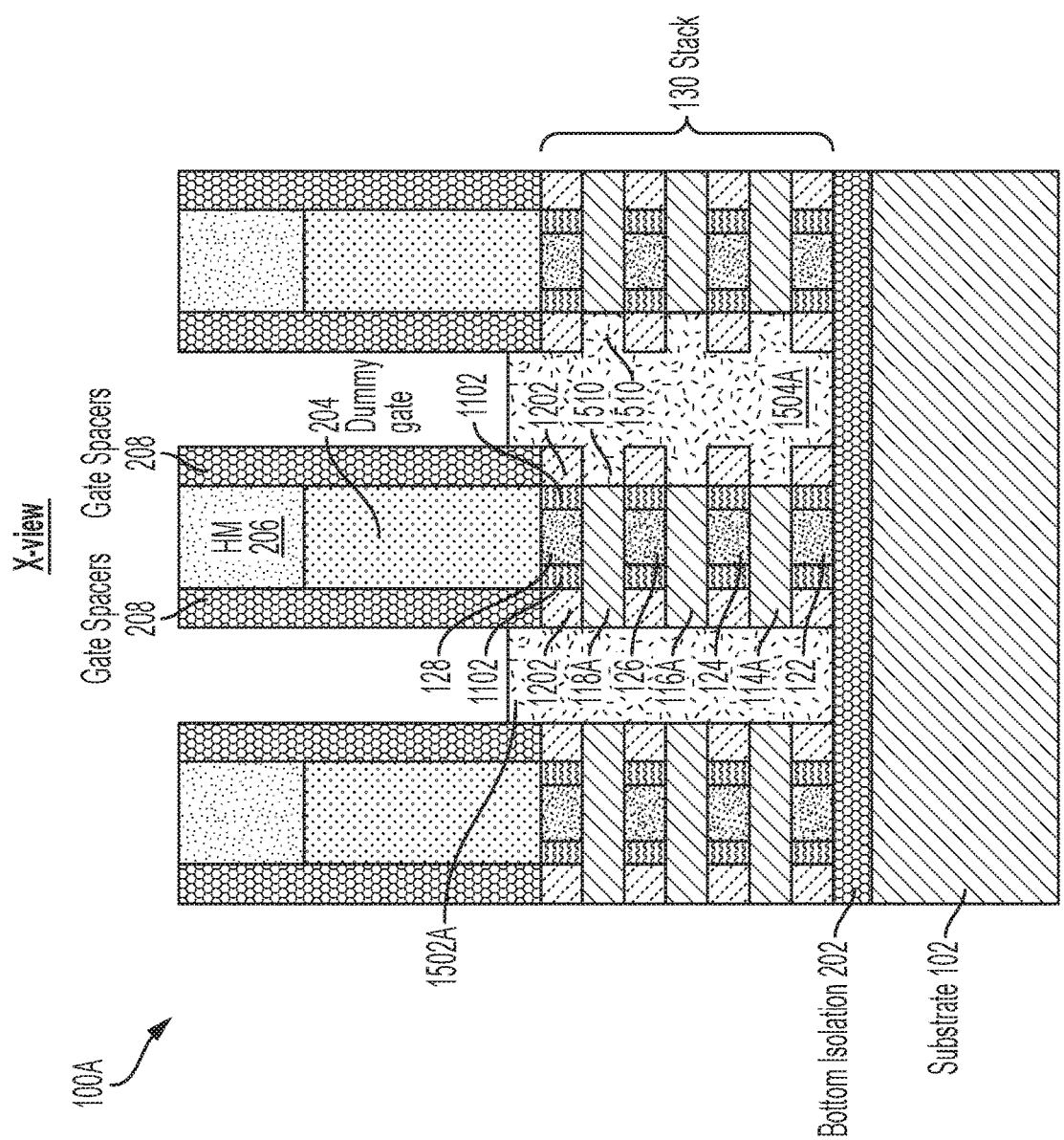

In FIG. 15, multiple fabrication operations have been performed to arrive at the nanosheet-based structure 100A. As shown in FIG. 15, known semiconductor device fabrication processes have been used to form source-side in-situ doped regions 1510 in a manner that fills the source-side channel cavities 1402 (shown in FIG. 14). In embodiments of the invention, the source-side in-situ doped regions 1510 can be formed in the same manner and using the same types of materials as the source-side in-situ doped regions 602 (shown in FIG. 6). In accordance with aspects of the invention, the source-side in-situ doped regions 1510 can be Si or SiGe. In the embodiments of the invention depicted in FIG. 15, the source-side in-situ doped regions 1510 are SiGe.

Referring still to FIG. 15, known fabrication operations have been used to form a doped drain region 1502A and a doped source region 1504A on exposed end regions of the source-side in-situ doped regions 1510, thereby creating initial p/n junctions at the interfaces between the Si nanosheets 114A, 116A, 118A and the drain region 1502A, and at the interfaces between the Si nanosheets 114A, 116A, 118A and the source-side in-situ doped regions 1510. The doped drain region 1502A and the doped source region 1504A are formed in substantially the same manner and using substantially the same materials and doping as the doped drain region 702A (shown in FIG. 7) and the doped source region 704A (shown in FIG. 7). The initial p/n junctions shown in FIG. 15 are substantially the same as the initial p/n junctions shown in FIG. 7. The initial p/n junctions shown in FIG. 15 are moved horizontally by exposing the structure 100A to one or more temperatures (or ranges of temperatures) in the same manner as the initial p/n junctions shown in FIG. 7.

The doped S/D regions 1502A, 1504A can be formed by a variety of methods, such as, for example, epitaxy; ultra-high vacuum chemical vapor deposition (UHVCVD); rapid thermal chemical vapor deposition (RTCVD); metal organic chemical vapor deposition (MOCVD); low-pressure chemical vapor deposition (LPCVD); limited reaction processing CVD (LRPCVD); and MBE. In embodiments of the invention, the doped S/D regions 1502A, 1504A can be doped during deposition (e.g., in-situ doped) by adding dopants such as n-type dopants (e.g., phosphorus or arsenic) or p-type dopants (e.g., Ga, B, $BF_2$, or Al) during the above-described methods of forming the doped drain region 1502A and the doped source region 1504A.

Figure 16:
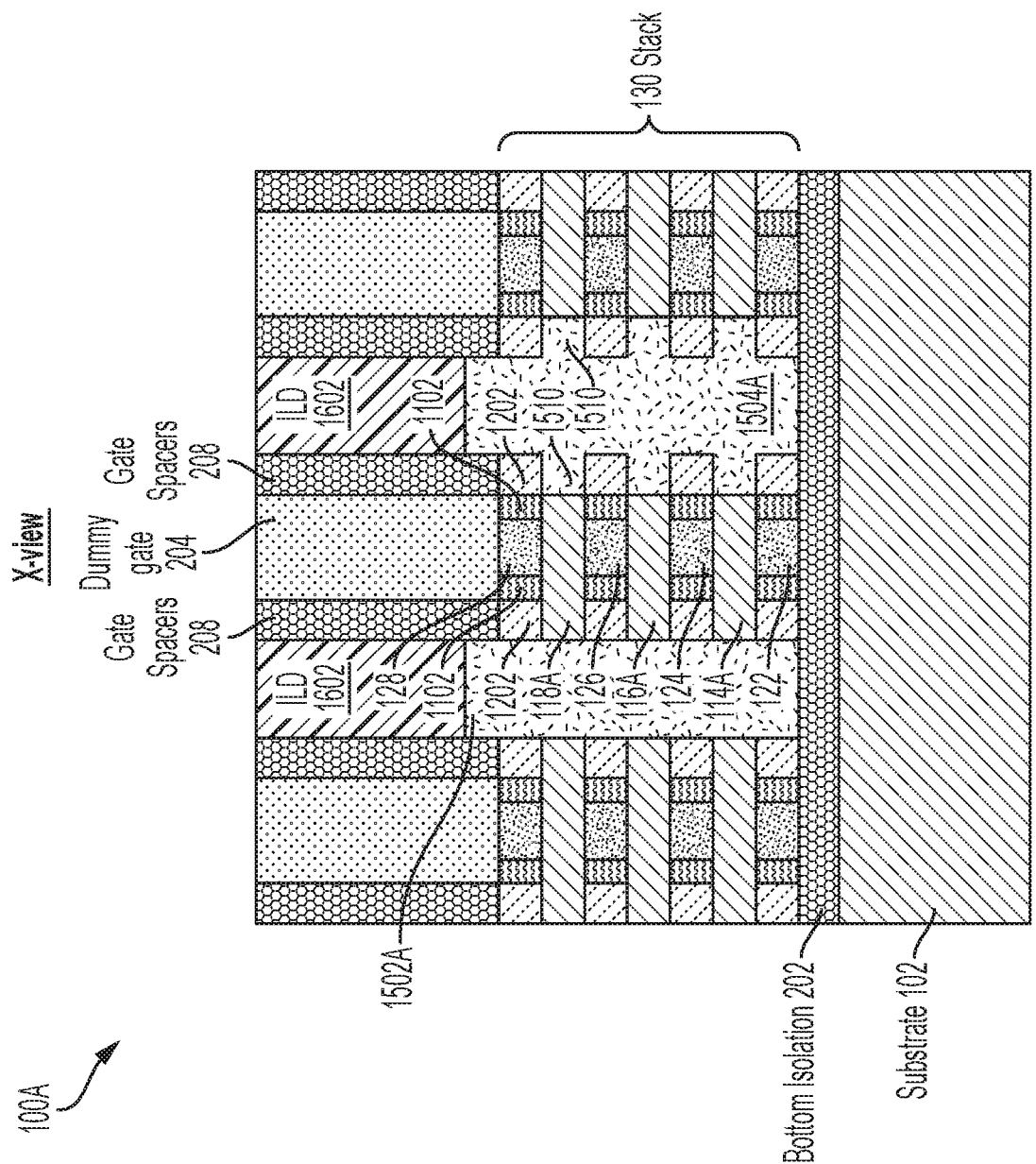

In FIG. 16, known semiconductor fabrication operations have been used to deposit an interlayer dielectric (ILD) material over the nanosheet-based structure 100A to fill in the remaining spaces of the structure 100A. The ILD material is planarized to the level shown in FIG. 16, thereby removing the hard masks 206 (shown in FIG. 15) and forming the ILD regions 1602. In aspects of the invention, the ILD regions 1602 can be formed from a low-k dielectric (e.g., k less than about 4) and/or an ultra-low-k (ULK) dielectric (e.g., k less than about 2.5).

Figure 17:
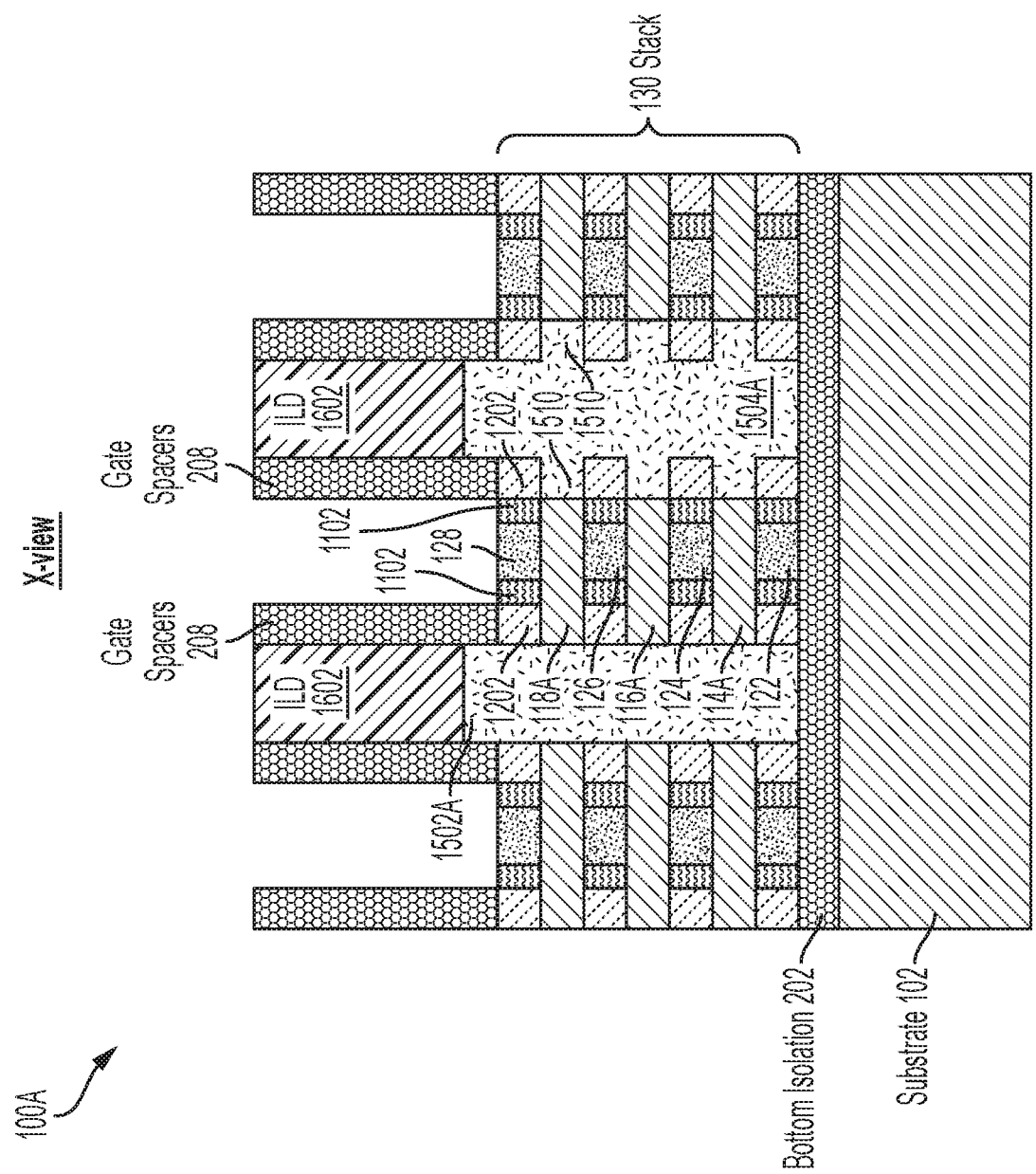

In FIG. 17, known fabrication operations have been used to remove the dummy gates 204 (shown in FIG. 16). The dummy gates 204 and the gate dielectric (not shown) can be removed by a known etching process, e.g., RIE or wet removal process.

In FIG. 18, known semiconductor fabrication operations have been used to remove the SiGe sacrificial nanosheets 122, 124, 126, 128. In embodiments of the invention, the sacrificial nanosheets 122, 124, 126, 128 are formed from SiGe, which can be selectively etched with respect to the Si nanosheets 114A, 116A, 118A using, for example, a vapor phase hydrogen chloride (HCL) gas isotropic etch process. Because the source-side in-situ doped regions 1510 are SiGe, the first inner spacers 1102 provide additional protection to ensure that the processes used to remove the SiGe sacrificial nanosheets 122, 124, 126, 128 do not also remove some or all of the source-side in-situ doped regions 1510.

In FIG. 19, known fabrication operations have been used to selectively remove the first inner spacers 1102.

FIG. 20 depicts a cross-sectional view of the nanosheet-based structure 100A after additional fabrication operations in accordance with aspects of the invention. Additionally, FIG. 20 depicts an isolated X-view of a region 2010 of the nanosheet-based structure 100A. Region 2010 depicts additional details of a nanosheet 116D', which, after the fabrication operations shown in FIG. 20, includes a drain-side extension region 1502B, the substantially undoped channel 116B, a source-side extension region 1504B, and an in-situ doped region 1510.

The nanosheet-based structure 100A in FIG. 20 is substantially the same as the nanosheet-based structure 100 shown in FIG. 9, with the exception that the in-situ doped region 602 (shown in FIG. 9) is Si, and the in-situ doped region 1510 (shown in FIG. 20) is SiGe. For structures shown in the nanosheet-based structure 100A of FIG. 20 having the same reference numbers as structures shown in the nanosheet-based structure 100 of FIG. 9, the structures shown in FIG. 20 have the same features (materials, fabrication method, functional characteristics, etc.) as the corresponding structures shown in FIG. 9. For structures shown in FIG. 20 that, although having a different reference number, are substantially the same as corresponding structures shown in FIG. 9, the structures shown in FIG. 20 have all the same features (materials, fabrication method, functional characteristics, etc.) as the corresponding structures shown in FIG. 9. More specifically, the region 2010 corresponds to the region 910; the nanosheet 116D' corresponds to the nanosheet 116D; the gradient in-situ doped channel 116C' corresponds to the gradient in-situ doped channel 116C; the drain-side extension region 1502B corresponds to the drain-side extension region 702B; the source-side extension region 1504B corresponds to the source-side extension region 704B; the in-situ doped region 1510 corresponds to the in-situ doped region 602; the in-situ doped region 1510A corresponds to the in-situ doped region 602A; the in-situ doped region 1510B corresponds to the in-situ doped region 602B; extension junctions 2030, 2032 correspond to the extension junctions 930, 932; the channel length (Lc) 2020 corresponds to the Lc 920; the gate length (Lg) 2002A corresponds to the Lg 902A; the inner spacers 1202 correspond to the inner spacers 402; and the HKMG 2002 corresponds to the HKMG 902.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent to, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of performing fabrication operations to form a transistor, wherein the fabrication operations include:
forming a nanosheet comprising a first nanosheet sidewall and a second nanosheet sidewall;
communicatively coupling the nanosheet to a source region at the first nanosheet sidewall;
communicatively coupling the nanosheet to a drain region at the second nanosheet sidewall;
wherein the nanosheet further comprises a source-side nanosheet region that includes the first nanosheet sidewall;
wherein the nanosheet further comprises a drain-side nanosheet region that includes the second nanosheet sidewall; and
providing dopants in the source-side nanosheet region by using an in-situ doping process;
wherein a doping concentration in the source-side nanosheet region is greater than a doping concentration of the drain-side nanosheet region.

2. The method of claim 1, wherein forming the source-side nanosheet region comprises:
forming an initial nanosheet structure; and
replacing a portion of the initial nanosheet structure with the source-side nanosheet region.

3. The method of claim 2, wherein replacing the portion of the initial nanosheet region structure with the source-side nanosheet region comprises epitaxially growing the source-side nanosheet region from an exposed surface of the initial nanosheet structure.

4. The method of claim 3, wherein the in-situ doping process is part of epitaxially growing the source-side nanosheet region from the exposed surface of the initial nanosheet structure.

5. The method of claim 2 further comprising, subsequent to the in-situ doping process, forming a source-side extension region by exposing the source-side nanosheet region to a first temperature that is sufficient to cause the dopants in the source-side nanosheet region to diffuse into the initial nanosheet structure.

6. The method of claim 1, wherein:
a gate structure is over a portion of the nanosheet;
the portion of the nanosheet comprises a channel region of the transistor; and
the channel region comprises a channel region bottom surface that defines a channel length dimension of the channel region.

7. The method of claim 6, wherein:
a first portion of the channel region bottom surface comprises a source-side channel region bottom surface; and
a length dimension of the source-side channel region bottoms surface comprises between about 20% and about 40% of the channel length dimension of the channel region.

8. A method of performing fabrication operations to form a nanosheet field effect transistor (FET) device, wherein the fabrication operations include:
forming a nanosheet comprising a first nanosheet sidewall and a second nanosheet sidewall;
communicatively coupling the nanosheet to a source region at the first nanosheet sidewall;
communicatively coupling the nanosheet to a drain region at the second nanosheet sidewall;
wherein the nanosheet further comprises a source-side nanosheet region that includes the first nanosheet sidewall;
wherein the nanosheet further comprises a drain-side nanosheet region that includes the second nanosheet sidewall; and
providing dopants in the source-side nanosheet region, wherein the providing dopants in the source-side nanosheet region comprises incorporating an in-situ doping process into a process used to form the source-side nanosheet region;
wherein a doping concentration in the source-side nanosheet region is greater than a doping concentration of the drain-side nanosheet region.

9. The method of claim 8, wherein the process used to form the nanosheet region comprises:
forming an initial nanosheet structure; and
replacing a portion of the initial nanosheet structure with the source-side nanosheet region.

10. The method of claim 9, wherein replacing the portion of the initial nanosheet structure with the source-side nanosheet region comprises epitaxially growing the source-side nanosheet region from an exposed surface of the initial nanosheet structure.

11. The method of claim 10, wherein the in-situ doping process is part of epitaxially growing the source-side nanosheet region from the exposed surface of the initial nanosheet structure.

12. The method of claim 9 further comprising, subsequent to the in-situ doping process, forming a source-side extension region by exposing the source-side nanosheet region to a first temperature that is sufficient to cause the dopants in the source-side nanosheet region to diffuse into the initial nanosheet structure.

13. The method of claim 8, wherein:
a gate structure is over a portion of the nanosheet;
the portion of the nanosheet comprises a channel region of the transistor; and
the channel region comprises a channel region bottom surface that defines a channel length dimension of the channel region.

14. The method of claim 13, wherein:
a first portion of the channel region bottom surface comprises a source-side channel region bottom surface; and
a length dimension of the source-side channel region bottoms surface comprises between about 20% and about 40% of the channel length dimension of the channel region.

15. A transistor comprising:
a nanosheet comprising a first nanosheet sidewall and a second nanosheet sidewall;
wherein the nanosheet is communicatively coupled to a source region at the first nanosheet sidewall;
wherein the nanosheet is communicatively coupled to a drain region at the second nanosheet sidewall;
wherein the nanosheet further comprises a source-side nanosheet region that includes the first nanosheet sidewall;
wherein the nanosheet further comprises a drain-side nanosheet region that includes the second nanosheet sidewall;

wherein the source-side nanosheet region comprises in-situ dopants; and wherein a doping concentration in the source-side nanosheet region is greater than a doping concentration of the drain-side nanosheet region.

16. The transistor of claim 15, wherein the source-side nanosheet region comprises multiple epitaxial layers.

17. The transistor of claim 16, wherein the nanosheet further comprises a source-side extension region communicatively coupled to the source-side nanosheet region.

18. The transistor of claim 15, wherein:

a gate structure is over a portion of the nanosheet;

the portion of the nanosheet comprises a channel region of the transistor; and the channel region comprises a channel region bottom surface that defines a channel length dimension of the channel region.

19. The transistor of claim 18, wherein a first portion of the channel region bottom surface comprises a source-side channel region bottom surface.

20. The transistor of claim 19, wherein a length dimension of the source-side channel region bottoms surface comprises between about 20% and about 40% of the channel length dimension of the channel region.

\* \* \* \* \*